US012765054B2

(12) United States Patent
Okamoto et al.

(10) Patent No.: US 12,765,054 B2
(45) Date of Patent: Oct. 13, 2026

(54) SEMICONDUCTOR DEVICE AND MANUFACTURING METHOD THEREOF

(71) Applicant: National Institute of Advanced Industrial Science and Technology, Tokyo (JP)

(72) Inventors: Mitsuo Okamoto, Ibaraki (JP); Atsushi Yao, Ibaraki (JP); Hiroshi Sato, Ibaraki (JP); Shinsuke Harada, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 338 days.

(21) Appl. No.: 18/563,937

(22) PCT Filed: Apr. 28, 2022

(86) PCT No.: PCT/JP2022/019342
§ 371 (c)(1),
(2) Date: Nov. 24, 2023

(87) PCT Pub. No.: WO2022/249855
PCT Pub. Date: Dec. 1, 2022

(65) Prior Publication Data

US 2024/0266351 A1 Aug. 8, 2024

(30) Foreign Application Priority Data

May 26, 2021 (JP) ................................ 2021-088393

(51) Int. Cl.
*H01L 27/092* (2006.01)
*H01L 21/82* (2006.01)
(Continued)

(52) U.S. Cl.
CPC ......... *H10D 84/856* (2025.01); *H10D 12/031* (2025.01); *H10D 30/65* (2025.01);
(Continued)

(58) Field of Classification Search
None
See application file for complete search history.

(56) References Cited

U.S. PATENT DOCUMENTS 9,184,237 B2 11/2015 Ryu et al.
2002/0158277 A1 10/2002 Harada et al.
(Continued)

FOREIGN PATENT DOCUMENTS

JP 2000-022140 A 1/2000
JP 2002-313945 A 10/2002
(Continued)

OTHER PUBLICATIONS

Okamoto et al., "Controlling Characteristics of 4H—SiC(0001) p-Channel MOSFETs Fabricated on Ion-Implanted n-Well", Materials Science Forum, vols. 717-720 (2012), pp. 781-784.
(Continued)

*Primary Examiner* — Asok K Sarkar
(74) *Attorney, Agent, or Firm* — XSENSUS LLP

(57) ABSTRACT

A semiconductor device includes, on an n-type semiconductor substrate, a power transistor, an n-type transistor, and a p-type transistor on a laminated semiconductor substrate that laminates an n-type drift layer, a p-type; the power transistor has a trench gate electrode penetrating through the base layer; the p-type transistor is formed in an n-type well region formed in the base layer, and the n-type transistor is formed in a p-type well region further formed in the base layer or n-type well region; and a p-type impurity concentration of the buried channel region of the p-type transistor is equal to a p-type impurity concentration of the base layer.

15 Claims, 18 Drawing Sheets

(51) Int. Cl.

| | |
|---|---|
| ***H10D 12/01*** | (2025.01) |
| ***H10D 30/65*** | (2025.01) |
| ***H10D 30/66*** | (2025.01) |
| ***H10D 62/10*** | (2025.01) |
| ***H10D 62/832*** | (2025.01) |
| ***H10D 64/01*** | (2025.01) |
| ***H10D 84/03*** | (2025.01) |
| ***H10D 84/85*** | (2025.01) |
| ***H10P 30/22*** | (2026.01) |

(52) U.S. Cl.
CPC ......... *H10D 30/668* (2025.01); *H10D 62/109* (2025.01); *H10D 62/8325* (2025.01); *H10D 64/01366* (2026.01); *H10D 84/035* (2025.01); *H10P 30/22* (2026.01)

(56) References Cited

U.S. PATENT DOCUMENTS

| | | | | |
|---|---|---|---|---|
| 2007/0298563 | A1 | 12/2007 | Fujishima et al. | |
| 2009/0085109 | A1 | 4/2009 | Izumi | |
| 2009/0280609 | A1* | 11/2009 | Akiba .................. | H10D 12/038 438/270 |
| 2018/0040690 | A1 | 2/2018 | Kobayashi et al. | |
| 2021/0167204 | A1* | 6/2021 | Ito ...................... | H10D 30/0297 |

FOREIGN PATENT DOCUMENTS

| | | | |
|---|---|---|---|
| JP | 2002-359294 | A | 12/2002 |
| JP | 2004-173292 | A | 6/2004 |
| JP | 2009-088220 | A | 4/2009 |
| JP | 2018-022852 | A | 2/2018 |

OTHER PUBLICATIONS

Okamoto et al., "First Demonstration of a Monolithic SiC Power IC Integrating a Vertical MOSFET with a CMOS Gate Buffer", The 33rd International Symposium on Power Semiconductor Devices and ICs (ISPSD), May 30-Jun. 3, 2021, Nagoya Full Virtual Conference, pp. 71-74.

Ryu et al., "1200 V 4H—SiC DMOSFET with an Integrated Gate Buffer", Materials Science Forum, vols. 778-780 (2014), pp. 939-942.

Okamoto et al., "Characteristics of 4H—SiC n- and p-Channel Metal-Oxide-Semiconductor Field-Effect Transistors with Ion-Implanted Buried Channel", Japanese Journal of Applied Physics 51(2012) 02BF05, Feb. 20, 2012, 4 pages.

International Search Report and Written Opinion mailed on Jul. 12, 2022, received for PCT Application PCT/JP2022/019342, filed on Apr. 28, 2022, 11 pages including English Translation.

* cited by examiner

SEMICONDUCTOR DEVICE AND MANUFACTURING METHOD THEREOF

CROSS-REFERENCE TO RELATED APPLICATIONS

The present application is based on PCT filing PCT/JP2022/019342, filed Apr. 28, 2022, which claims priority to Japanese Patent Application No. 2021-088393, filed May 26, 2021, the entire contents of each are incorporated herein by reference.

TECHNICAL FIELD

The present invention relates to a semiconductor device and a manufacturing method thereof, for example, an effective technique applied to a semiconductor device using a SiC substrate and a manufacturing method thereof.

BACKGROUND ART

In a field of power semiconductor devices that control high voltages and large currents, silicon carbide (SiC) semiconductors having excellent low on-resistance, high-speed operation, and high temperature characteristics in comparison with those of silicon semiconductors are paid attention to.

FIG. 6 and FIG. 7 of Patent Document 1 disclose a semiconductor device mounting, on a SiC substrate, a vertical power MOSFET that has a planar type gate structure and a CMOS gate driver that drives the vertical power MOSFET. The CMOS gate driver has a configuration in which an n-type MOSFET and a p-type MOSFET are connected in series FIG. 1 of Patent Document 2 discloses a trench MOSFET that is formed by using epitaxial growth and ion implantation and has an n-layer 15*b*, an $n^-$-layer 15*a*, and a p-type channel region 16, and an impurity concentration ratio of the n-layer 15*b* and the $n^-$-layer 15*a* is set to a desired range, thereby suppressing short-channel effects.

Patent document 3 describes, mainly in a silicon-based semiconductor, a semiconductor device in which a CMOS gate driver and a vertical p-type power MOS having a trench gate structure are monolithically integrated in a silicon-based semiconductor.

FIG. 2 of Non-Patent Document 1 discloses a SiC p-type MOSFET structure, and describes that a threshold voltage and mobility can be adjusted by a buried channel structure (EBC: Epitaxial Buried Channel) provided in a p-type epitaxial growth layer.

RELATED ART DOCUMENTS

Patent Documents

Patent Document 1: U.S. Pat. No. 9,184,237
Patent Document 2: JP 2018-22852 A
Patent Document 3: JP 2002-359294 A

Non-Patent Documents

Non-patent Document 1: M Okamoto et al, Materials Science Forum Vols. 717-720, (2012), pp. 781-784

SUMMARY OF THE INVENTION

Problems to be Solved by the Invention

In order to make the SiC power transistor a high-speed switch, parasitic inductance between the drive circuit (gate driver) and the power transistor needs to be reduced and the ultimate means are integration of the drive circuit and the power transistor. Patent Document 1 discloses the integration of the CMOS gate drivers and the power transistors for the same purpose, but does not sufficiently make consideration about structural alignment of the power transistors and the gate drivers, thereby having a problem for cost reduction.

Other problems and novel features will become apparent from the description of the present specification and the accompanying drawings.

Means for Solving the Problems

A semiconductor device according to one embodiment includes, on an n-type semiconductor substrate, a power transistor, an n-type transistor, and a p-type transistor on a laminated semiconductor substrate that laminates an n-type drift layer, a p-type; the power transistor has a trench gate electrode penetrating through the base layer; the p-type transistor is formed in an n-type well region formed in the base layer, and the n-type transistor is formed in a p-type well region further formed in the base layer or n-type well region; and a p-type impurity concentration of the buried channel region of the p-type transistor is equal to a p-type impurity concentration of the base layer.

A manufacturing method of a semiconductor device according to one embodiment includes: a step of preparing a semiconductor substrate having a first main surface and a second main surface opposing the first main surface, the first main surface including a power transistor region and a CMOS region; a step of forming a first semiconductor layer of a first conductivity type on the first main surface of the semiconductor substrate by using an epitaxial growth method; a step of forming a second semiconductor layer on the first semiconductor layer by using the epitaxial growth method, and forming a first portion of the first conductivity type and a second portion of the second conductivity type in the second semiconductor layer by using an ion implantation method; a step of forming a third semiconductor layer of the second conductivity type on the second semiconductor layer by using the epitaxial growth method; a step of forming a well region of the first conductivity type in the CMOS region by using the ion implantation method; a step of forming a trench groove penetrating through the third semiconductor layer and having a depth reaching the second semiconductor layer in the power transistor region; and a step of forming a power transistor in the power transistor region by providing a power source region in the third semiconductor layer, a trench gate insulating film and a trench gate electrode in the trench groove, forming a p-type MOSFET in the CMOS region by providing a first source region, a buried channel region, and a first drain region in the well region, a first gate insulating film and a first gate electrode on the buried channel region, and forming an n-type MOSFET in the CMOS region by providing a second source region, a channel region, and a second drain electrode in the third semiconductor layer, a second gate insulating film and a second gate electrode on the channel region, in which in the step of forming the well region, an impurity of the first conductivity type is ion-implanted at a position deeper than that of the buried channel region so as to leave the buried channel region of the second conductivity type, the buried channel region having a desired thickness on a surface of the third semiconductor layer.

Effects of the Invention

According to one embodiment, the cost of the semiconductor device can be reduced.

DETAILED DESCRIPTION OF PREFERRED EMBODIMENTS

Figure 1:
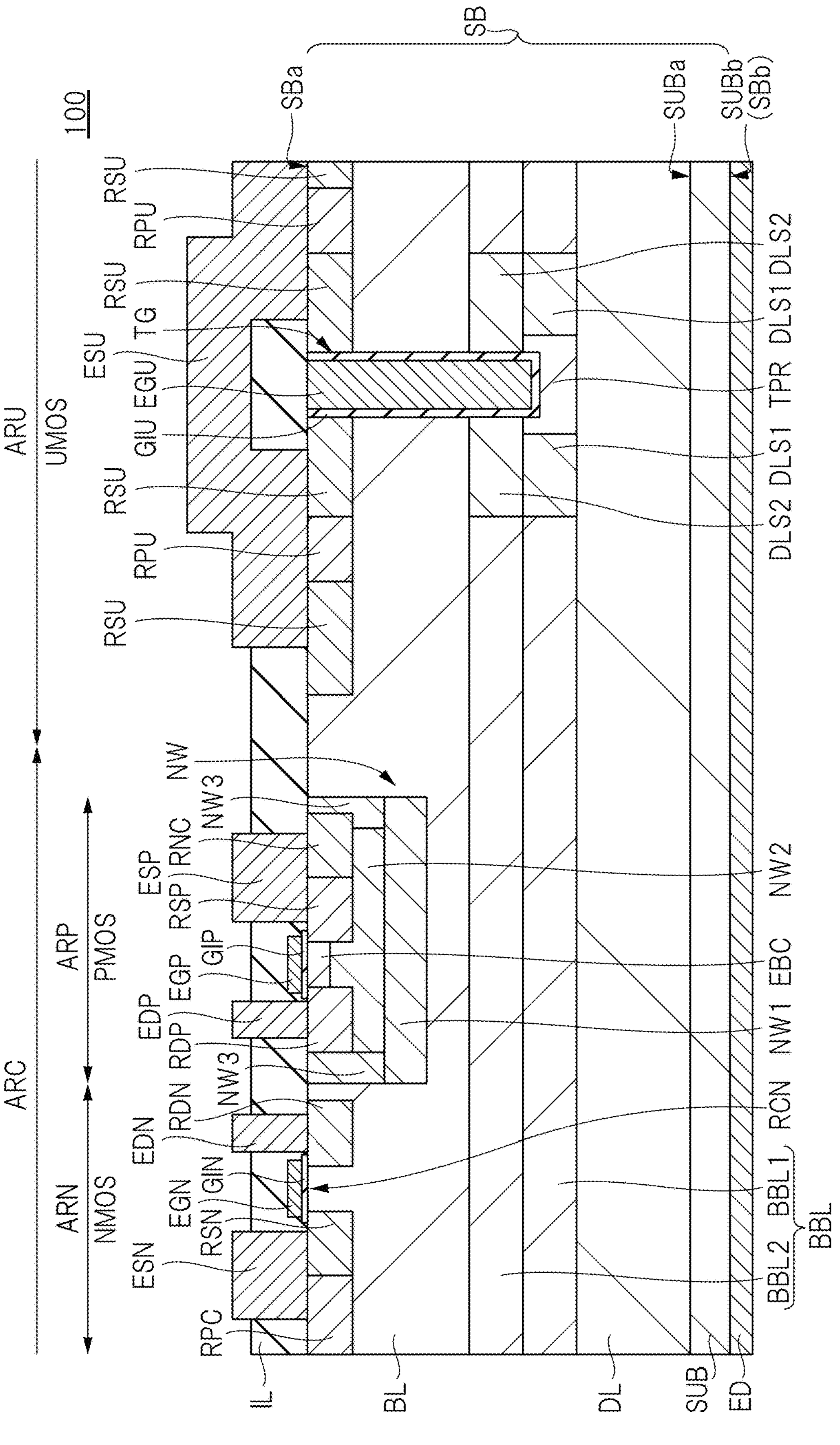
FIG. 1 is a cross-sectional view of a semiconductor device according to the present embodiment.

Hereinafter, embodiments will be described in detail based on the drawings. Incidentally, in all the drawings for explaining the embodiments, members having the same function are denoted by the same reference numerals and a repetitive description thereof will be omitted. Even a plan view may be hatched for ease of understanding. Also, for example, 2e17 $cm^{-3}$ means $2\times10^{17}$ $cm^{-3}$ in terms of an impurity concentration.

EMBODIMENT

<Regarding Semiconductor Device of Present Embodiment>

Figure 2:
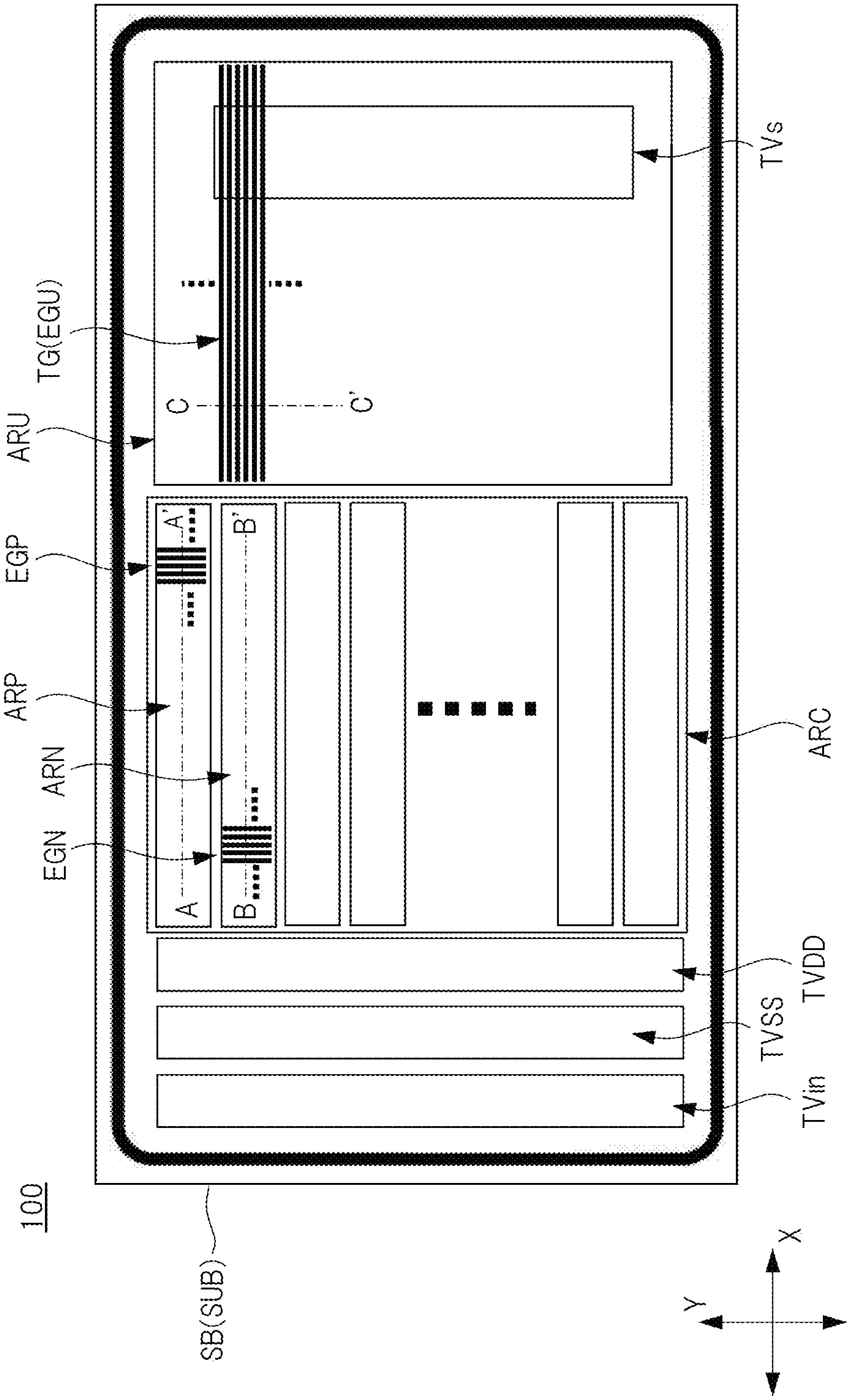
FIG. 2 is a plan view of the semiconductor device according to the present embodiment.
Figure 3:
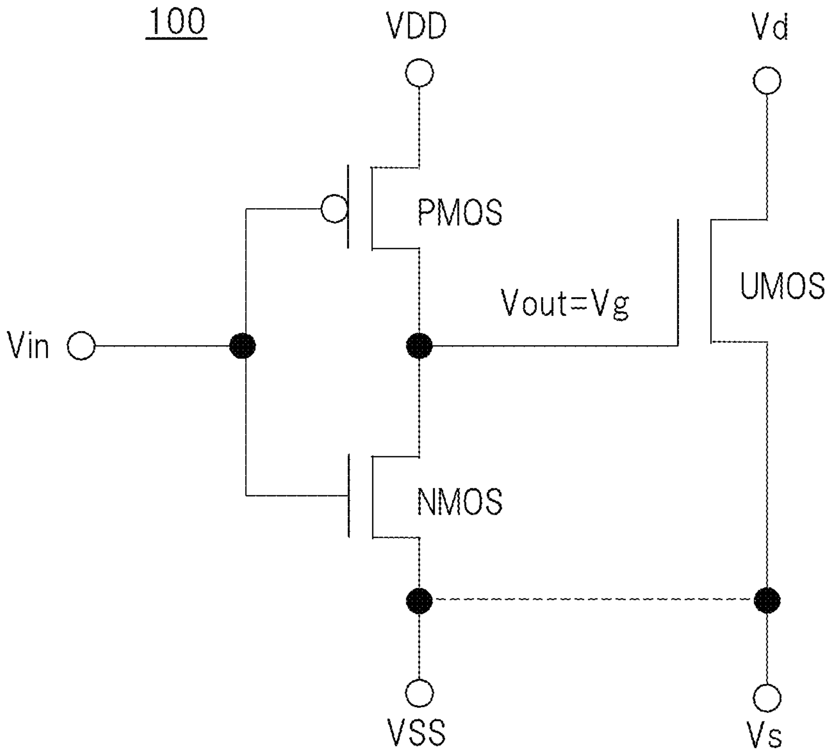
FIG. 3 is an equivalent circuit diagram of the semiconductor device according to the present embodiment.
Figure 4:
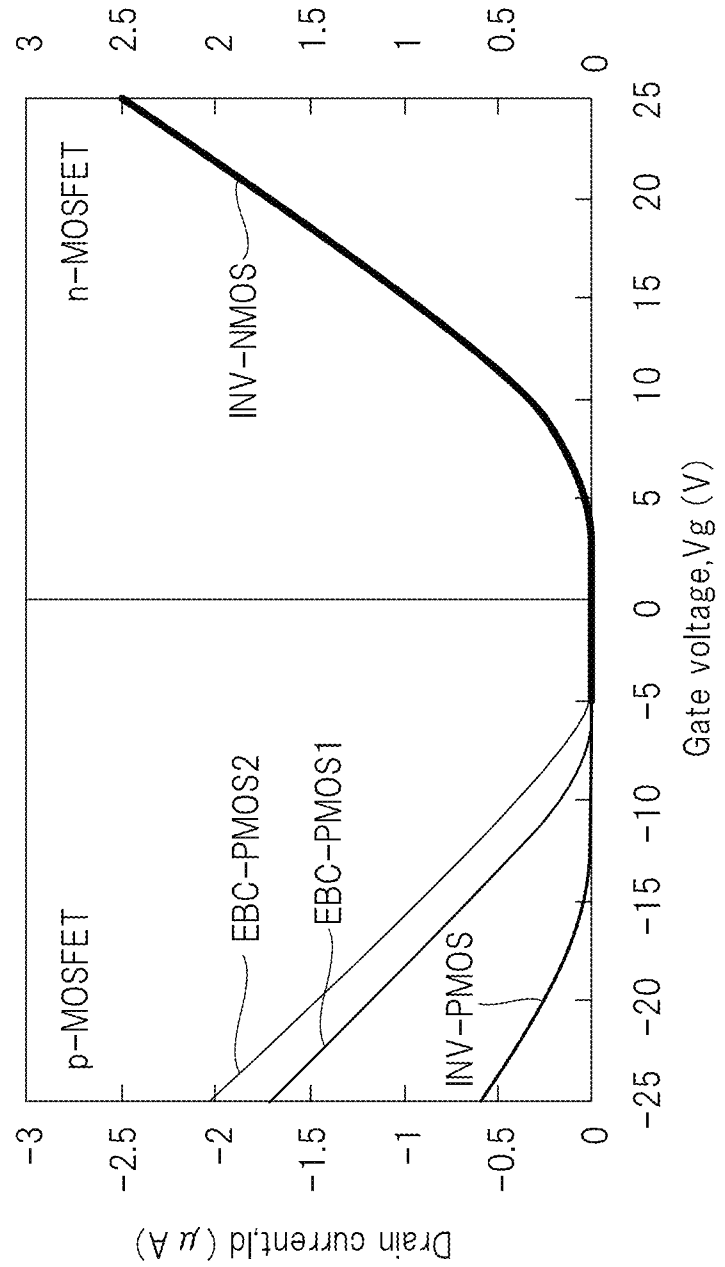
FIG. 4 is a diagram showing a relationship between a gate voltage and a drain current of a n-type transistor and a p-type transistor according to the present embodiment.
Figure 5:
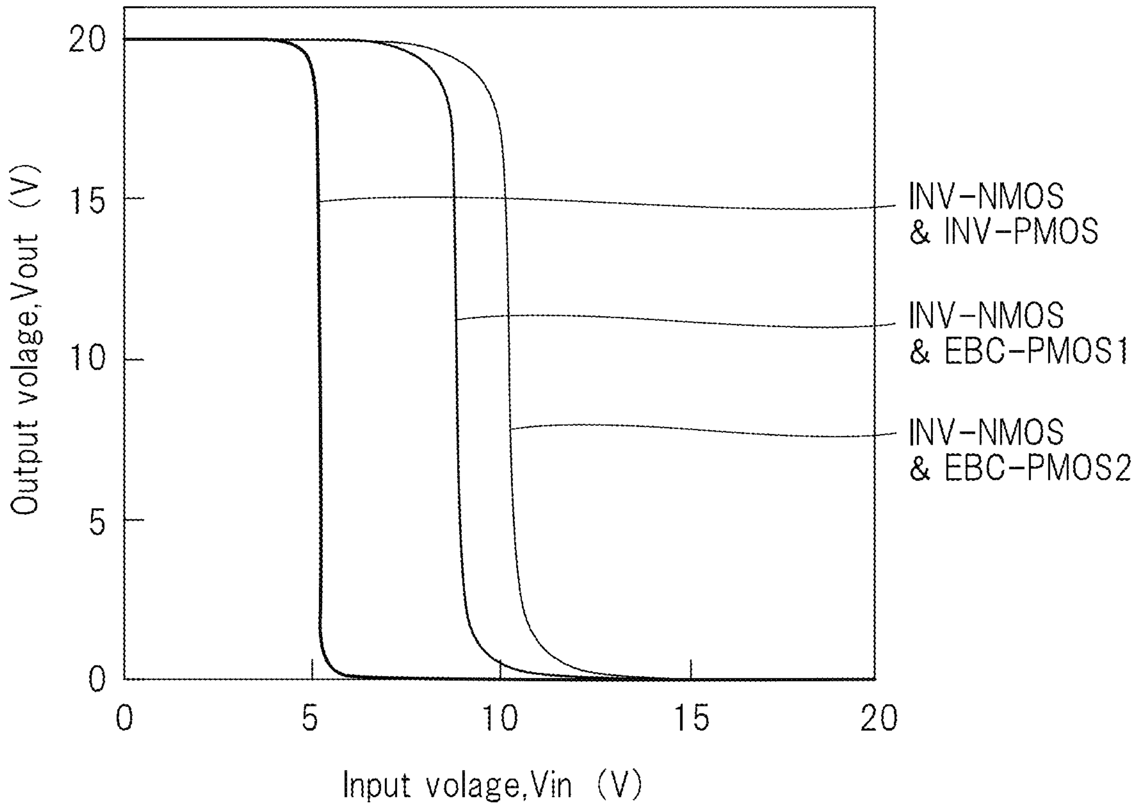
FIG. 5 is a diagram showing a relationship between an input voltage and an output voltage of a CMOS inverter according to the present embodiment.

FIG. 1 is a cross-sectional view of a semiconductor device according to the present embodiment, FIG. 2 is a plan view of the semiconductor device according to the present embodiment, and FIG. 3 is an equivalent circuit diagram of the semiconductor device according to the present embodiment. FIG. 4 is a diagram showing a relationship between a gate voltage and a drain current of a n-type transistor and a p-type transistor according to the present embodiment, and FIG. 5 is a diagram showing a relationship between an input voltage and an output voltage of a CMOS inverter of the present embodiment. Incidentally, FIG. 1 is each cross-sectional view of A-A', B-B', and C-C' of FIG. 2, but shows a continuous cross-sectional structure of a unit transistor in each region.

As shown in FIG. 3, a semiconductor device 100 includes a power transistor (power MOSFET) UMOS, a p-type transistor (p-type MOSFET) PMOS and a n-type transistor (n-type MOSFET) NMOS that configure a gate drive circuit of the power transistor UMOS. The gate drive circuit is a CMOS inverter, the p-type transistor PMOS and the n-type transistor NMOS are connected in series, a source of the p-type transistor PMOS is connected to a CMOS power supply potential VDD, and a source of the n-type transistor NMOS is connected to a CMOS reference potential VSS. A source of the power transistor UMOS is connected to a power source Vs, and a drain thereof is connected to a power drain Vd. Then, a gate of the p-type transistor PMOS and a gate of the n-type transistor NMOS are connected to an input signal Vin, and a drain of the p-type transistor PMOS and a drain of the n-type transistor NMOS are connected to a gate of the power transistor UMOS. An output Vout of the drive circuit of a CMOS inverter configuration is inputted to the gate of the power transistor UMOS as an input signal Vg of the power transistor UMOS.

As shown in FIG. 2, the semiconductor device 100 includes an input signal terminal TVin, a CMOS reference potential terminal TVSS, a CMOS power supply potential terminal TVDD, a power source terminal TVs, a CMOS region ARC, and a power transistor region ARU In an X-direction of FIG. 2, the CMOS region ARC is arranged in a central portion, and the input signal terminal TVin, CMOS reference potential terminal TVSS, and CMOS power supply potential terminal TVDD are arranged on one side (left side) of the CMOS region ARC and the power transistor region ARU is arranged on the other side (right side) of the CMOS region ARC. Incidentally, the power source terminal TVs is arranged in the power transistor region ARU and over the power transistor UMOS shown in FIG. 1.

Next, the CMOS region ARC and the power transistor region ARU shown in FIG. 2 will be described with reference to FIG. 1. The CMOS region (drive circuit region) ARC includes a plurality of PMOS regions ARP and a plurality of NMOS regions ARN. A number of p-type transistors PMOS are arranged side by side in the X-direction in the PMOS region ARP. Namely, the large number of gate electrodes EGP extending, for example, 100 μm in a Y-direction orthogonal to the X-direction is arranged in the X direction, and a drain region RDP and a source region RSP shown in FIG. 1 are arranged so as to sandwich each gate electrode EGP. Since the X-direction is a gate length direction of the p-type transistor PMOS, the Y-direction is a gate width direction, and a large number of p-type transistors PMOS are connected in parallel, one p-type transistor PMOS can be considered. Although the description is omitted for overlap, a large number of n-type transistors NMOS arranged in the NMOS region ARN are also configured similar to the p-type transistors PMOS described above. Further, as shown in FIG. 2, the plurality of PMOS regions ARP and the plurality of NMOS regions ARN are alternately arranged in the Y-direction. Then, since the p-type transistors PMOS of respective stages are connected in parallel to each other, the plurality of p-type transistor PMOS formed in the CMOS region ARC configure one p-type transistor PMOS having a high amplification gain as a whole. Incidentally, the plurality of n-type transistors NMOS formed in the CMOS region ARC also configure similarly one n-type transistor NMOS having a high amplification gain.

The PMOS region ARP and the NMOS region ARN are alternately arranged in multiple stages in the Y-direction, but are not limited thereto and the plurality of PMOS regions ARP and the plurality of NMOS regions ARN may be collected respectively and arranged together. Further, a ratio of amplification gain may also be adjusted by adjusting a ratio of the number of stages of the PMOS region ARP and the number of stages of the NMOS region ARN.

A number of power transistors UMOS are arranged in the power transistor region ARU and, as shown in FIG. 1, a gate electrode EGU of the power transistor UMOS is provided in a trench groove TG, and a source region RSU is provided on both sides of the trench groove TG. As shown in FIG. 2, a number of trench grooves TG (in other words, gate electrode EGU) extend in the X-direction and, in the Y-direction, a source region RSU is arranged on both sides of each trench groove TG. Namely, the source region RSU also extends in the X-direction along the trench groove TG. A large number of source regions RSU extending in the X-direction are connected to each other by a metal wiring (source electrode ESU of FIG. 1), and a large number of gate electrodes EGU extending in the X-direction are also connected to each other by a metal wiring different from the source electrode ESU. Thus, a large number of power transistors UMOS formed in the power transistor region ARU are configured as one low-on-resistance power transistor UMOS. Incidentally, an extension direction of the trench groove TG is defined as the X-direction (in other words, a direction orthogonal to the extension direction of the gate electrode EGN of the n-type transistor NMOS and the gate electrode EGP of the p-type transistor PMOS), but is limited to this and may be in the Y-direction (in other words, a direction parallel to the extension direction of the gate electrode EGN of the n-type transistor NMOS and the gate electrode EGP of the p-type transistor PMOS).

As shown in FIG. 1, the semiconductor device 100 includes the power transistor region ARU and the CMOS region (drive circuit region) ARC, the power transistor UMOS being formed in the power transistor region ARU, and the n-type transistor NMOS and the p-type transistor PMOS being formed in the CMOS region ARC. The power transistor UMOS is a trench gate type power MOSFET having a gate, a source, and a drain; the n-type transistor NMOS is a surface channel type MOSFET having a gate, a source, and a drain; and the p-type transistor PMOS is a buried channel type MOSFET having a gate, a source, and a drain. The power transistor UMOS, the n-type transistor NMOS, and the p-type transistor PMOS are formed in a laminated semiconductor substrate SB.

The laminated semiconductor substrate SB is configured by: a semiconductor substrate SUB having a first main surface (main surface) SUBa and a second main surface (rear surface) SUBb that oppose each other; a drift layer (n-type semiconductor layer) DL formed on the first main surface of the semiconductor substrate SUB; a buried base layer (p-type semiconductor layer) BBL formed on the drift layer DL; and a base layer (p-type semiconductor layer) BL formed on the buried base layer BBL. The laminated semiconductor substrate SB has a first main surface (main surface) SBa and a second main surface (rear surface) SBb that oppose each other, the first main surface SBa coinciding with a surface (upper surface) of the base layer BL, and the second main surface (rear surface) SBb coinciding with the second main surface SUBb of the semiconductor substrate SB. The first main surface SBa (or the first main surface SUBa) of the laminated semiconductor substrate SB (or semiconductor substrate SUB) is provided with the power transistor region ARU and the CMOS region ARC.

The semiconductor substrate SUB is a n-type silicon carbide substrate, whose polytype is 4H. Namely, the semiconductor substrate SUB is n-type 4H—SiC. The first main surface SUBa of the semiconductor substrate SUB is, for example, a surface provided with an off angle of 4° in a <11-20> direction that is an off direction of crystal from a (0001) plane, and this surface is called a 4° off (0001) plane. The drift layer DL is an n-type semiconductor layer having an n-type impurity concentration of about 1e16 $cm^{-3}$, and is an epitaxial layer having a film thickness of about 9.5 μm and formed on the first main surface SUBa of the semiconductor substrate SUB by using an epitaxial growth method. The buried base layer BBL is a p-type semiconductor layer having a p-type impurity concentration of about 1e18 $cm^{-3}$ and formed on the drift layer DL by using an epitaxial growth method and an ion implantation method. A thickness of the buried base layer BBL is about 1 μm. The buried base layer BBL is configured by a laminated structure of a buried base layer BBL1 and a buried base layer BBL2, and each of film thicknesses of the buried base layers BBL1 and BBL2 is about 0.5 μm. The base layer BL is a p-type semiconductor layer having a p-type impurity concentration of about 1.3e17 $cm^{-3}$, and is an epitaxial layer having a film thickness of about 1.8 μm formed on the buried base layer BBL by using an epitaxial growth method. The film thickness of the base layer BL is larger than the film thickness of the buried base layer BBL. Then, the p-type impurity concentration of the base layer BL is lower than the p-type impurity concentration of the buried base layer BBL. On the base layer BL, a channel forming region of the power transistor UMOS is formed in the power transistor region ARU, and the n-type transistor NMOS and the p-type transistor PMOS are formed in the CMOS region ARC. By forming the base layer BL as an epitaxial layer that is formed by an epitaxial growth method, the relatively thick base layer BL can be formed without using a special ion implanter capable of outputting ion implantation energy of MeV class. This improves a degree of freedom of breakdown voltage design and the like in the CMOS region ARC.

The semiconductor substrate SUB, the drift layer DL, and the base layer BL are provided across the entirety of the power transistor region ARU and the CMOS region ARC. The buried base layer BBL is provided throughout the entirety of the CMOS region ARC and is selectively provided in the power transistor region ARU. A trench protection region (p-type semiconductor region) TPR is provided at a bottom portion of the trench groove TG, and a JFET layer 1 (n-type semiconductor layer) DLS1 and a JFET layer 2 (n-type semiconductor layer) DLS2 are provided around the trench groove TG and the trench protection region TPR. In the power transistor region ARU, the buried base layer BBL is arranged in a region other than a region where the trench protection region TPR, the JFET layer 1 DLS1, and the JFET layer 2 DLS2 are provided. Further, a drain electrode ED is formed over the entire region of the power transistor region ARU and the CMOS region ARC on the second main surface SUBb of the semiconductor substrate SUB.

The trench groove TG penetrating the source region RSU and the base layer BL from the first main surface SBa of the laminated semiconductor substrate SB is formed in the power transistor region ARU, and a gate insulating film (trench gate insulating film) GIU and a gate electrode (trench gate electrode) EGU are formed in the trench groove TG. The gate insulating film GIU is a silicon oxide film deposited by using a CVD method, and has a film thickness of 50 to 150 nm. The gate electrode EGU is formed of a polycrystalline silicon film containing n-type impurities. A source region (n-type semiconductor region) RSU and a p-type region (p-type semiconductor region) RPU are formed in the base layer BL on a first main surface SBa side of the laminated semiconductor substrate SB. The source region RSU is arranged on both sides of the trench groove TG so as to sandwich the trench groove TG. The P-type region (p-type semiconductor region) RPU is located on an opposite side of the trench groove TG or the gate electrode EGU with respect to the source region RSU. In other words, it can be said that the p-type region RPU is arranged between the source regions RSU of adjacent unit transistors. Then, the source region RSU and the p-type region RPU are connected to a source electrode ESU.

A p-type impurity concentration of the trench protection region (p-type semiconductor region) TPR provided at the bottom portion of the trench groove TG is equal to a p-type impurity concentration of the buried base layer BBL (in particular, the buried base region BBL1), and is higher than a p-type impurity concentration of the base layer BL. The trench protection region (p-type semiconductor region) TPR is an electric field relaxation layer and is made a structure in which the trench groove TG bites into the trench protection region TPR at the bottom portion of the trench groove TG in order to mitigate convergence of an electric field to the gate insulating film GIU at the bottom portion of the trench groove TG. Namely, it is critical that a depth of the trench groove TG is larger than the total film thickness of the base layer BL and the buried base layer BBL2 and smaller than the total film thickness of the base layer BL and the buried base layer BBL. In view of the film thickness of each of the above-mentioned layers, about 2.5 to 2.6 μm is suitable. In a region between the drift layer DL and the base layer BL, the trench protection region TPR is sandwiched between the JFET layers 1 (n-type semiconductor layer) DLS1, and the trench groove TG is sandwiched between the JFET layers 2 (n-type semiconductor layer) DLS2. At the bottom portion of the trench groove TG, the gate insulating film GIU is covered with the trench protection region TPR, so that dielectric breakdown of the gate insulating film GIU can be prevented. Furthermore, by optimizing the n-type impurity concentrations of the JFET layer 1 DLS1 and the JFET layer 2 DLS2, the dielectric breakdown of the gate insulating film GIU can be prevented without increasing JFET resistance.

In addition, the buried base layer BBL having a p-type impurity concentration higher than the p-type impurity concentration of the base layer BL is provided between the drift layer DL and the base layer BL, so that a breakdown voltage between the drain and the source can be improved. Further, since the base layer BL on which a channel of the power transistor UMOS is formed is formed of an epitaxial layer having a low impurity concentration, high channel mobility can be ensured and the on-resistance of the power transistor UMOS can be reduced. Namely, by providing the buried base layer BBL and the base layer BL that have different p-type impurity concentrations, improvement of the breakdown voltage between the drain and the source and a reduction of the on-resistance can be realized without being influenced mutually.

Incidentally, although a structure having the trench protection region (p-type semiconductor region) TPR is shown as one embodiment, the trench protection region TPR is not essential for obtaining effects of the present invention. In addition, other electric field relaxation structures may also be applied to the power transistor UMOS without departing from the scope of the present invention.

Next, the n-type transistor NMOS and the p-type transistor PMOS formed in the CMOS region ARC will be described. As shown in FIG. 1, the n-type transistor NMOS and the p-type transistor PMOS are formed in the base layer BL. The n-type transistor NMOS is formed in the NMOS region ARN within the CMOS region ARC, and the p-type transistor PMOS is formed in the PMOS region ARP within the CMOS region ARC.

The n-type transistor NMOS has: a source region (n-type semiconductor region) RSN and a drain region (n-type semiconductor region) RDN that are formed in the base layer BL; a channel region RCN provided between the source region RSN and the drain region RDN; and a gate electrode EGN formed on the channel region RCN via the gate insulating film GIN. The n-type transistor NMOS is a surface channel type MOSFET, and when a desired voltage is applied to the gate electrode EGN, a channel is formed in the channel region RCN just below an interface between the base layer BL and the gate insulating film GIN. Since the channel region RCN provided between the source region RSN and the drain region RDN of the n-type transistor NMOS is a portion of the p-type base layer BL and the ion implantation with impurities for threshold voltage adjustment is performed to the channel region RCN, the p-type impurity concentration of the channel region RCN is equal to the p-type impurity concentration of the base layer BL. Here, "equal" includes "approximately equal". This means that the p-type impurity, the n-type impurity, or the like is not intentionally ion-implanted into the channel region RCN and the base layer BL and that is the not ion-implanted epitaxial layer remains. Even if an error in the p-type impurity concentrations of both is not intended in the manufacturing process of the semiconductor device, its difference is included in "equal" of the present embodiment. Incidentally, the p-type impurity concentration of the base layer BL means, for example, the p-type impurity concentration in the channel forming region of the power transistor UMOS. Although an example of the n-type transistor NMOS of a surface channel type has been described herein, for example, the n-type transistor NMOS of a buried channel type that has ion-implanted n-type ions into the channel region RCN may be used instead thereof. Since damage to the crystal due to the n-type ion implantation is small and the channel mobility reduction as seen in the aluminum ion implantation described later does not occur, characteristic control by the buried channel is possible.

The p-type transistor PMOS is formed in an n-type well region (n-type semiconductor region) NW formed in the base layer BL. The p-type transistor PMOS has a source region (p-type semiconductor region) RSP and a drain region (p-type semiconductor region) RDP formed in the n-type well region NW, and a gate electrode EGP formed on the first main surface SBa of the laminated semiconductor substrate SB via the gate insulating film GIP. The p-type transistor PMOS is the buried channel MOSFET, and has a buried channel region EBC with a thickness of about 0.2 μm from the first main surface SBa of the laminated semiconductor substrate SB. The buried channel region EBC is the p-type semiconductor region which is a region within the n-type well NW, but where n-type impurities are not substantially ion-implanted. When a desired voltage is applied to the gate electrode EGP, the channel is formed not just below the interface between the buried channel region EBC and the gate insulating film GIP but at a location deeper than a location of the interface. The n-type well region NW is configured by an n-type well layer 1 (n-type semiconductor layer) NW1, an n-type well layer 2 (n-type semiconductor layer) NW2, and an n-type well layer 3 (n-type semiconductor layer) NW3. The n-type well layer 1 NW1 is provided at a relatively deep position from the first main surface SBa of the laminated semiconductor substrate SB, and the n-type well layer 2 NW2 is provided on the n-type well layer 1 NW1. The n-type well layer 1 NW1 and the n-type well layer 2 NW2 are formed by ion-implanting nitrogen ions into the base layer BL, for example. The n-type well layer 1 NW1 is formed within a range of a depth of 0.7 to 0.5 μm from the first main surface SBa, and the n-type well layer 2 NW2 is formed within a range of a depth of 0.5 to 0.2 μm from the first main surface SBa. The base layer BL, which is an epitaxial layer not ion-implanted within a range of a depth of 0.2 μm from the first main surface SBa, remains, and this portion becomes the buried channel region EBC. Accordingly, the p-type impurity concentration of the buried channel region EBC is equal to the p-type impurity concentration of the base layer BL. Incidentally, the p-type impurity concentration of the base layer BL means the p-type impurity concentration in the channel forming region of the power transistor UMOS, for example. Here, "equal" includes "approximately equal". It is important that the p-type impurity, the n-type impurity, or the like is not intentionally ion-implanted into the buried channel region EBC. Even if an error in the p-type impurity concentrations of both is not intended in the manufacturing process of the semiconductor device, its difference is included in "equal" in the present embodiment. By the way, an error range is ±50% or less (in a range of 0.65 to 1.95e17 $cm^{-3}$). Further, it is important that the p-type impurity, the n-type impurity, or the like is not intentionally ion-implanted in the buried channel region EBC, so that it can be said that defect density between the buried channel region EBC and the base layer BL is equal. Incidentally, the defect density of the base layer BL means, for example, defect density in the channel forming region of the power transistor UMOS. The n-type impurity concentration of the n-type well layer 2 NW2 is 2e17 $cm^{-3}$ to 5e17 $cm^{-3}$, the n-type impurity concentration of the n-type well layer 1 NW1 is 5e17 $cm^{-3}$ to 1e19 $cm^{-3}$, and the n-type impurity concentration of the n-type well layer 1 NW1 is equal to or higher than the n-type impurity concentration of the n-type well layer 2 NW2. Also, the n-type well layer 3 NW3 is arranged outside the source region RSP and the drain region RDP so as to surround the source region RSP and the drain region RDP. Preferably, the n-type impurity concentration of the n-type well layer 2 NW2 is lower than the n-type impurity concentration of the n-type well layer 1 NW1. The n-type well layer 3 NW3 has a n-type impurity concentration equal to that of the n-type well layer 1 NW1, and is continuously formed so as to reach the n-type well layer 1 NW1 from the first main surface SBa of the laminated semiconductor substrate SB.

By relatively lowering the n-type impurity concentration of the n-type well layer 2 NW2 that has contact with the buried channel region EBC, controllability and a degree of freedom of design of the p-type impurity concentration of the buried channel region EBC can be improved, and threshold voltage controllability of the p-type transistor PMOS can be improved. Further, by relatively increasing the n-type impurity concentration of the n-type well layer 1 NW1, a depletion layer from the drain region RDP can be prevented from punching through the n-type well region NW by the drain voltage. Also, a parasitic Bip transistor configured by the source region RSP/n-type well region NW/base layer BL can be prevented from being turned on.

Next, an effect of forming the buried channel region EBC of the p-type transistor PMOS with an epitaxial layer will be described. Conventionally, the following problem has been known: channel mobility is lowered and on-resistance is increased in order that an interface level exists at high densities on a MOS interface in a MOSFET formed on a SiC substrate. This interface level is generated, for example, in a thermal treatment step at a time of forming a gate oxide film, especially a problem of an increase in a threshold voltage of a PMOS is serious. According to results of the study, a donor-like trap (hole trap) exists near a center of a bandgap, and once the holes are trapped, no de-trapping in thermal energy due to the large bandgap of SiC occurs. The trapped holes behave as effective positive fixed charges, and the threshold voltage of the PMOS is negatively shifted. Namely, the threshold voltage of the PMOS increases. The hole trap also exists in the NMOS, and if a gate bias is negatively applied, the effective positive fixed charge is generated. However, when the gate bias is positively applied to induce inversion electrons in the channel, the inverted electrons and the holes in the hole trap recombine to return to electrically neutral and do not affect the electrical characteristics. The inventor(s) of the present application has examined that in a case of the PMOS, the ion implantation method is used to form a buried channel in order to avoid the effect of the positive fixed charges described above. However, it has found that if p-type impurities such as aluminum ions are ion-implanted into the SiC substrate, injection defects occur and an adverse effect of a reduction in the channel mobility occurs. In the present embodiment, the on-resistance and the threshold voltage of the p-type transistor PMOS can be reduced because the buried channel region EBC of the p-type transistor PMOS is formed of an epitaxial layer and no impurity is implanted by the ion implantation.

FIG. 4 is a diagram showing a relationship between a gate voltage and a drain current of an n-type transistor NMOS and a p-type transistor PMOS according to the present embodiment. INV-PMOS and INV-NMOS are a p-type transistor PMOS and an n-type transistor NMOS of a surface channel type, and EBC-PMOS1 and EBC-PMOS2 are p-type transistors PMOS of a buried channel type. The EBC-PMOS1 has a structure in which a thickness of the buried channel region EBC is 0.15 μm, and the EBC-PMOS2 has a structure in which a thickness of the buried channel region EBC is 0.2 μm. Incidentally, for electrical characteristic measurement, a MOSFET having a gate length of 100 μm and a gate width of 150 μm is used. As shown in FIG. 4, in the p-type transistor PMOS of a buried channel type of the present embodiment, an increase in drain current (in other words, a reduction in on-resistance) and a reduction in threshold voltage can be confirmed in comparison with the p-type transistor PMOS of a surface channel type.

FIG. 5 is a diagram showing a relationship between an input voltage and an output voltage of a CMOS inverter according to the present embodiment. It can be seen that by using the p-type transistor PMOS of a buried channel type of the present embodiment, a switching voltage of the CMOS inverter is approximately half of a CMOS power supply voltage and a balance between a LOW level noise margin and a HIGH level noise margin is improved in comparison with a case where the p-type transistor PMOS of a surface channel type is used.

<Regarding Manufacturing Method of Semiconductor Device of Present Embodiment>

FIGS. 6 to 12 are cross-sectional views showing a manufacturing process of the semiconductor device 100 according to the present embodiment.

Figure 6:
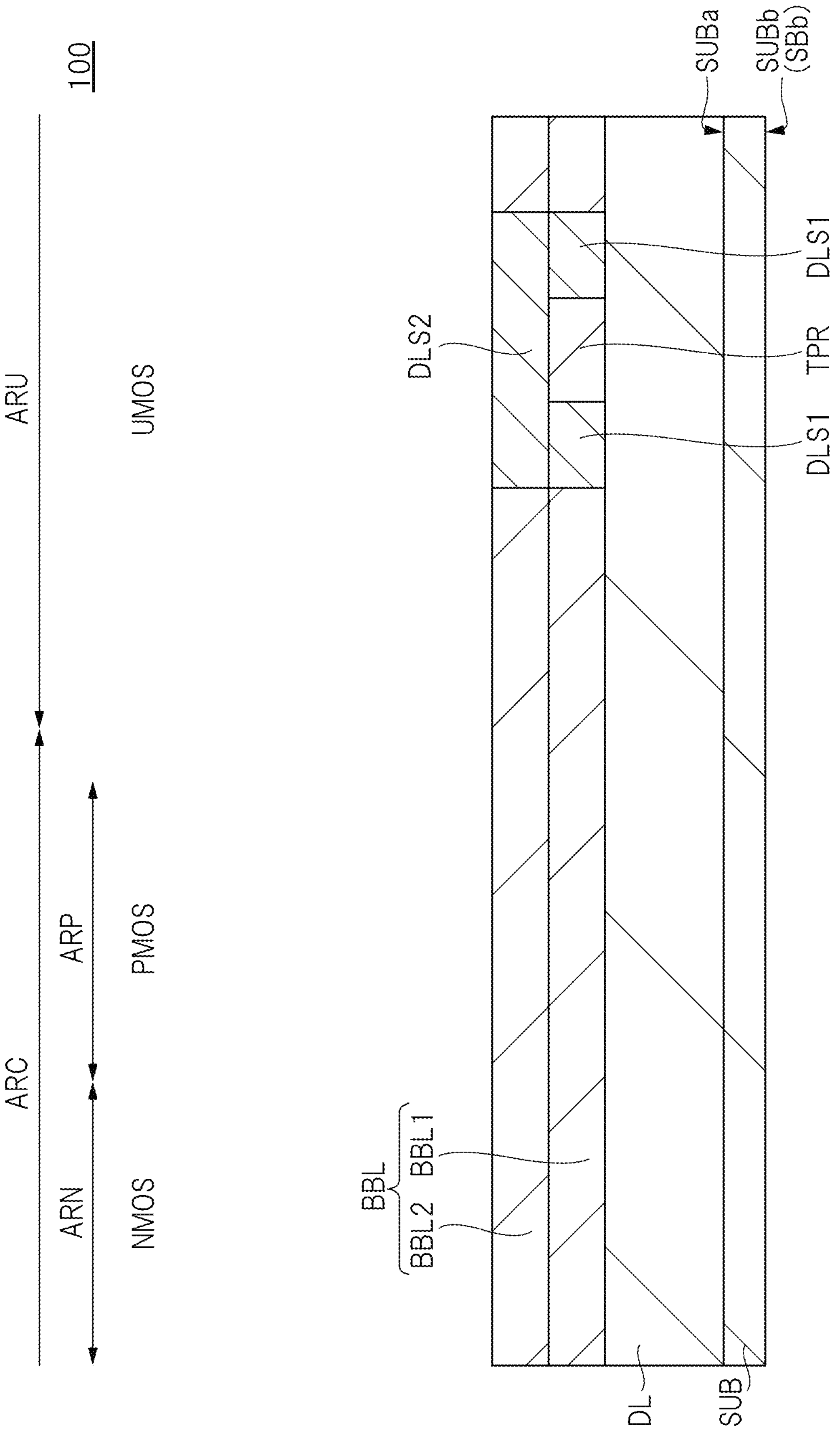
FIG. 6 is a cross-sectional view showing a manufacturing process of the semiconductor device according to the present embodiment.

As shown in FIG. 6, a manufacturing step of the drift layer DL and the buried base layer BBL is performed. The buried base layer BBL is a laminated structure of the buried base layer 1 BBL1 and the buried base layer 2 BBL2. First, a semiconductor substrate SUB having a first main surface (main surface) SUBa and a second main surface (rear surface) SUBb opposing each other is prepared. The semiconductor substrate SUB is an n-type silicon carbide (4H-SiC) substrate, and the first main surface SUBa is the above-mentioned 4° off (0001) plane.

An n-type drift layer DL is formed on the first main surface SUBa of the semiconductor substrate SUB by using an epitaxial growth method. The drift layer DL is an n-type epitaxial layer to which nitrogen (N), phosphorus (P), or the like is added and that has an n-type impurity concentration of 1e16 $cm^{-3}$ and a film thickness of about 10 μm.

Next, a buried base layer BBL1 and a trench protection region TPR are selectively formed on a surface of the drift layer DL. In the buried base layer BBL1 and the trench protection region TPR, a mask layer is selectively provided on the drift layer DL, and a p-type impurity (Al ion) is ion-implanted into a region exposed from the mask layer to form a p-type semiconductor layer. As shown in FIG. 6, the buried base layer BBL1 and the trench protection region TPR are formed in the power transistor region ARU, and a buried base layer BBL1 is formed in the CMOS region ARC. The buried base layer BBL1 and the trench protection region TPR have a p-type impurity concentration of 1e18 $cm^{-3}$ and a film thickness of about 0.5 μm. In the power transistor region ARU, a portion of the drift layer DL remains in a region covered by the mask layer, and a JFET layer 1 DLS1 is formed on both sides of the trench protection region TPR. The n-type impurity concentration of the JFET layer 1 DLS1 is 1e16 $cm^{-3}$.

Next, a buried base layer 2 BBL2 is formed on the buried base layer 1 BBL1 and a JFET layer 2 DLS2 is formed on the trench protection region TPR and the JFET layer 1 DLS1. First, an epitaxial growth method is used on the buried base layer 1 BBL1, the trench protection region TPR, and the JFET layer 1 DLS1 to form an n-type epitaxial layer. The epitaxial layer has an n-type impurity concentration of 1e16 $cm^{-3}$ and a film thickness of about 0.5 μm. A mask layer is selectively provided on the epitaxial layer, and a p-type impurity (Al ion) is ion-implanted into a region exposed from the mask layer to form a p-type semiconductor layer. Thus, a buried base layer 2 BBL2 is formed in the region exposed from the mask layer, and a JFET layer 2 DLS2 is formed in a region covered by the mask layer. The p-type impurity concentration of the buried base layer 2 BBL2 overlapping the buried base layer 1 BBL1 is 1e18 $cm^{-3}$, the film thickness thereof is about 0.5 μm, and the n-type impurity concentration of the JFET layer 2 DLS2 that is connected to the base layer 1 BBL1 and overlaps the trench protection region TPR and the JFET layer 1 DLS1 is 1e16 $cm^{-3}$, and the film thickness thereof is about 0.5 μm. Incidentally, the drift layer DL, the JFET layer 1 DLS1, and the JFET layer 2 DLS2 are set to the same impurity concentration, but the n-type impurity concentration of each layer may be individually set as described in FIGS. 1 and 10 of Patent Document 2 (JP 2018-22852).

Figure 7:
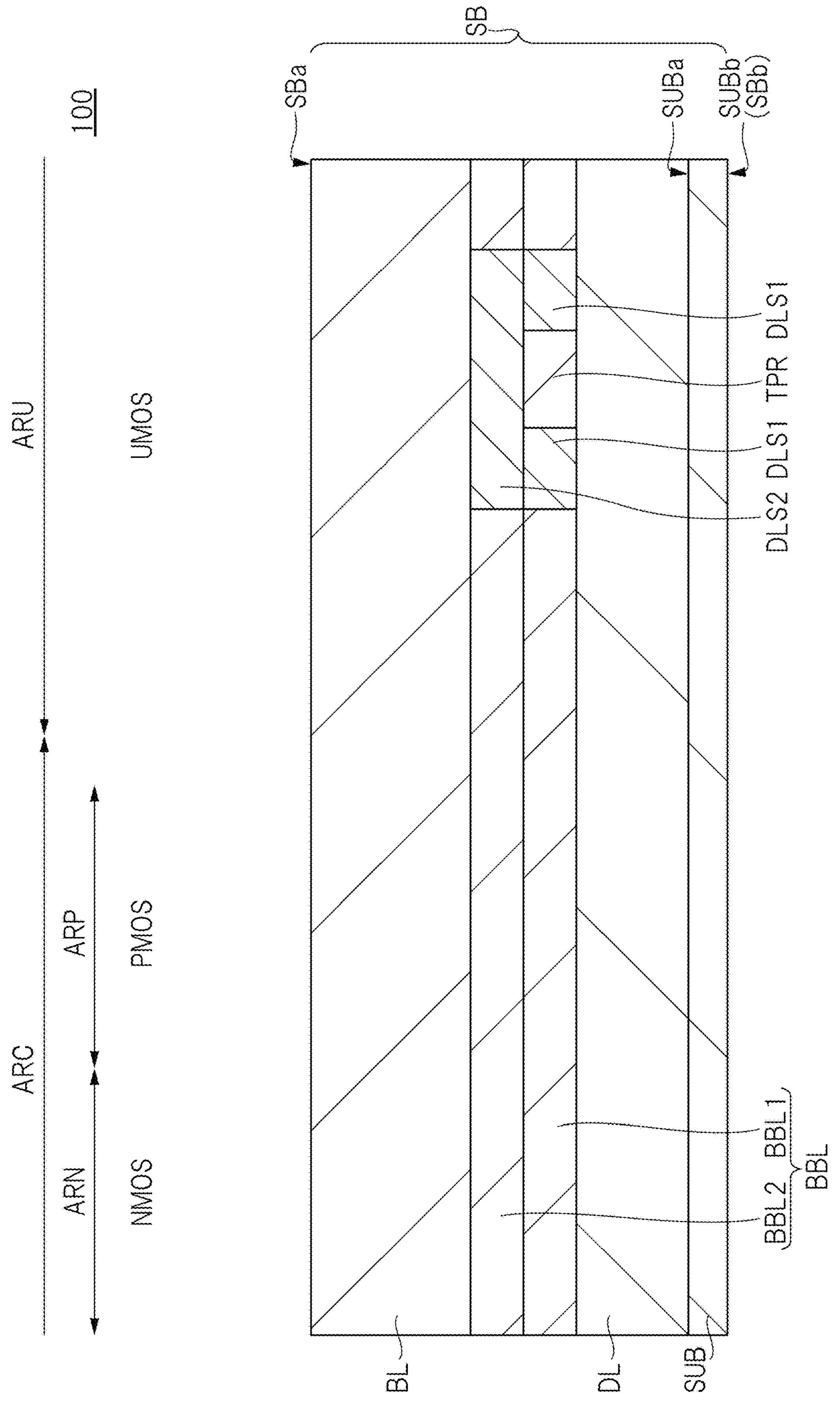
FIG. 7 is a cross-sectional view showing the manufacturing process of the semiconductor device subsequent to FIG. 6.

Next, as shown in FIG. 7, a manufacturing step of the base layer BL is performed. A p-type base layer BL is formed on the buried base layer BBL and the JFET layer 2 DLS2 by using an epitaxial growth method. The base layer BL is a p-type epitaxial layer to which a p-type impurity such as aluminum (Al) is added, and its p-type impurity concentration is 1.3e17 $cm^{-3}$, and its film thickness is about 1.8 μm. The base layer BL is formed across the entirety of the power transistor region ARU and the CMOS region ARC.

Figure 8:
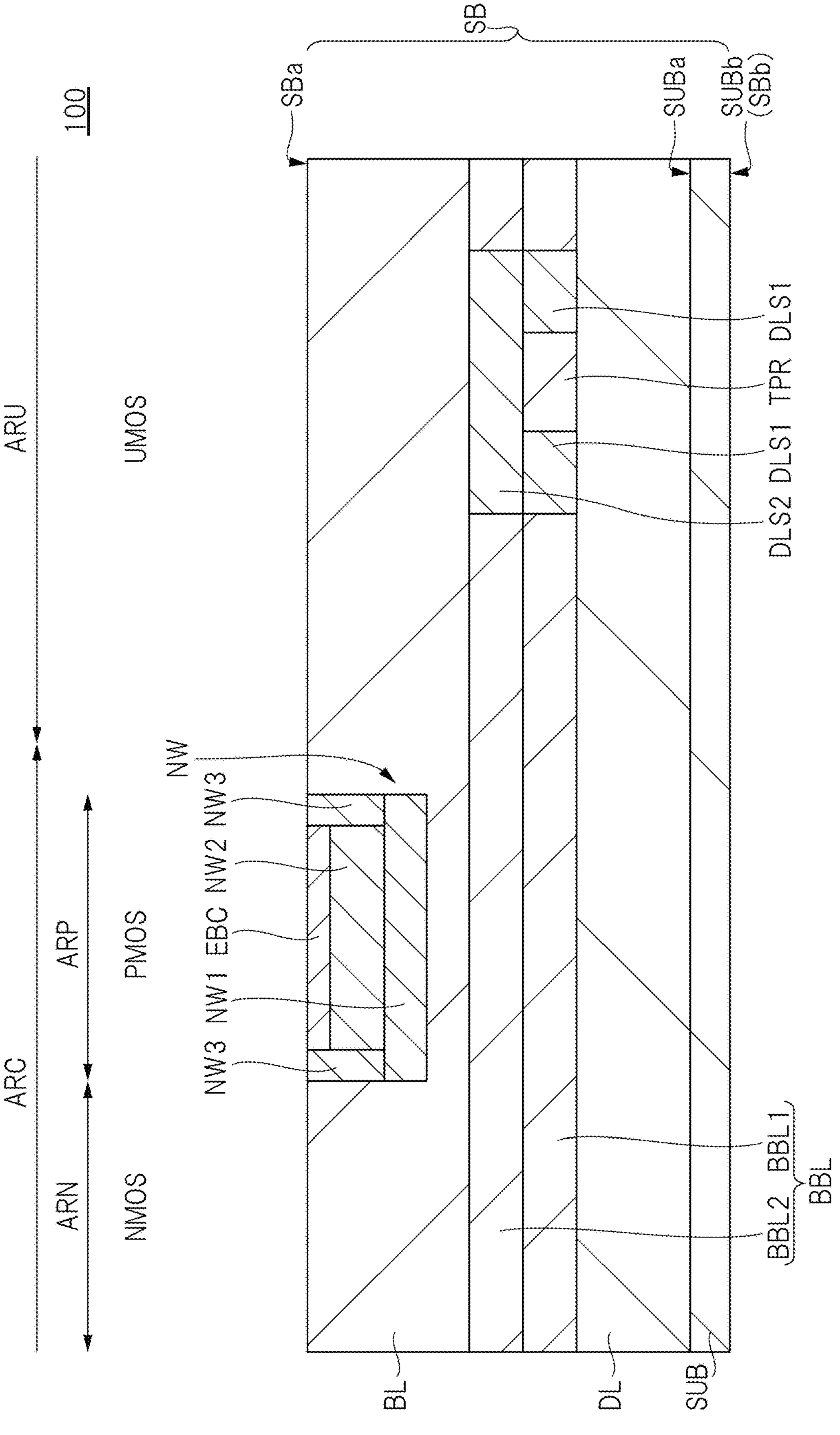
FIG. 8 is a cross-sectional view showing the manufacturing process of the semiconductor device subsequent to FIG. 7.

Next, as shown in FIG. 8, a manufacturing step of the n-type well region NW and the buried channel region EBC is performed. The n-type well region NW is configured by an n-type well layer 1 NW1, an n-type well layer 2 NW2, and an n-type well layer 3 NW3. The n-type well layer 1 NW1 and the n-type well layer 2 NW2 are formed by ion-implanting nitrogen (N) ions into the base layer BL with use of an ion implantation method. From a surface of the base layer BL (in other words, the first main surface SBa of the laminated semiconductor substrate SB), the n-type well layer 1 NW1 having a thickness of 0.2 μm in a range of a depth of 0.7 to 0.5 μm is formed, and the n-type well layer 2 NW2 having a thickness of 0.3 μm in a range of a depth of 0.5 to 0.2 μm is formed. Then, a buried channel region EBC having a thickness of 0.2 μm in a range of a depth of 0.2 μm from the surface of the base layer BL. Incidentally, a threshold voltage of the p-type transistor PMOS changes according to a balance between the concentration and thickness of the buried channel region EBC and the concentration and thickness of the n-type well layer 2 NW2. These conditions can be adjusted to obtain the desired characteristics. The buried channel region EBC is a region where the p-type semiconductor layer, which is an epitaxial layer, remains without the ion-implantation of the n-type impurities into the base layer BL. In addition, an n-type well layer 3 NW3 that reaches the n-type well layer 1 NW1 from the surface of the base layer BL is formed. Namely, the n-type well layer 3 NW3 is continuously formed in a range of a depth of 0.5 μm or more from the surface of the base layer BL. The n-type well layer 3 NW3 is formed by the ion implantation of nitrogen (N) ions, but is formed, for example, in a multistage ion implantation step in which implantation energy is changed. The n-type well layer 3 NW3 is formed into an annular shape in a plan view so as to contact with the n-type well layer 2 NW2 and the buried channel region EBC and surround a periphery thereof. The n-type impurity concentration of the n-type well layer 2 NW2 is 2e17 $cm^{-3}$ to 5e17 $cm^{-3}$, the n-type impurity concentration of each of the n-type well layer 1 NW1 and the n-type well layer 3 NW3 is 5e17 $cm^{-3}$ to 1e19 $cm^{-3}$, and the n-type impurity concentration of each of the n-type well layer 1 NW1 and the n-type well layer 3 NW3 is equal to or higher than the n-type impurity concentration of the n-type well layer 2 NW2. Preferably, the n-type impurity concentration of the n-type well layer 2 NW2 is made lower than the n-type impurity concentration of the n-type well layer 1 NW1.

Figure 9:
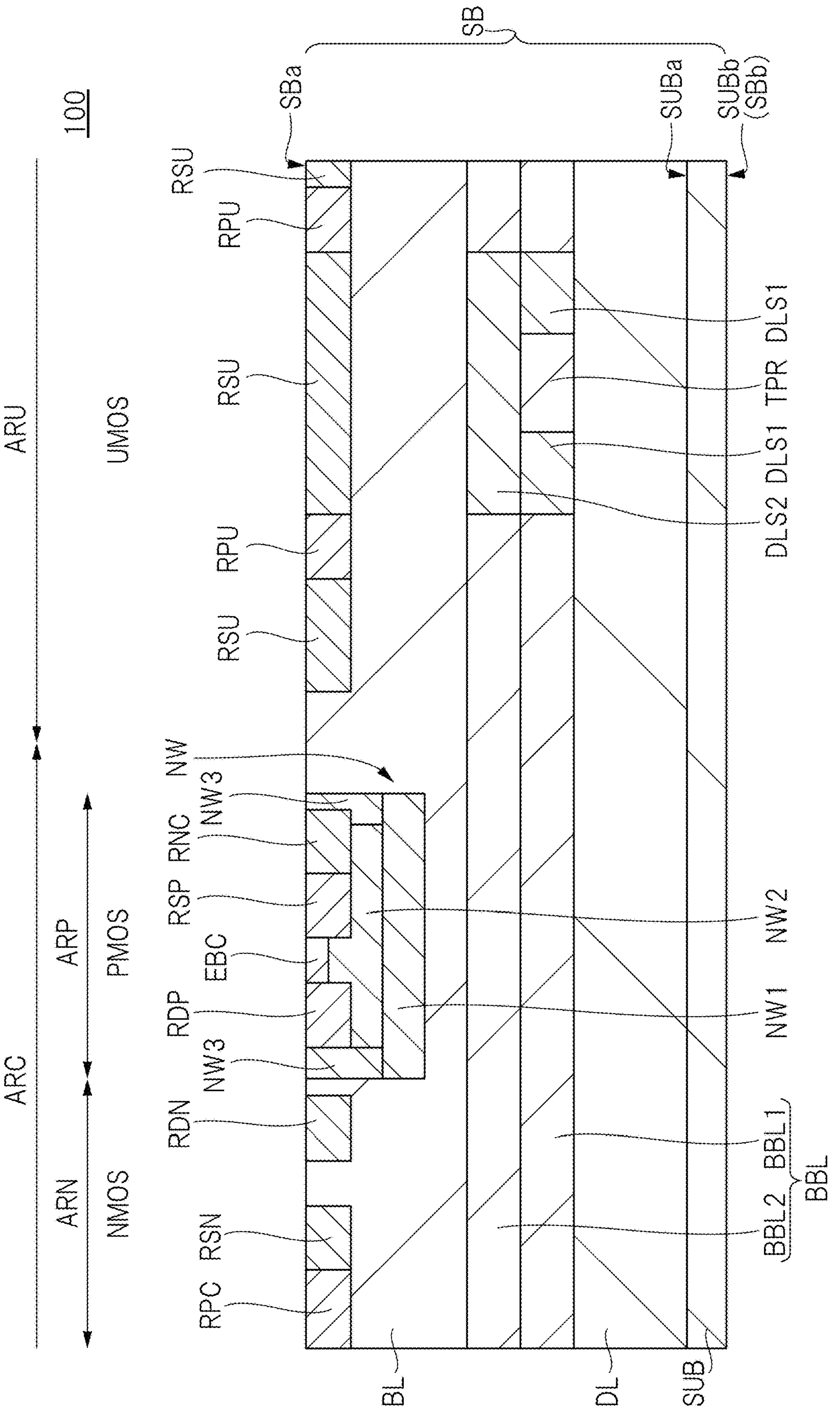
FIG. 9 is a cross-sectional view showing the manufacturing process of the semiconductor device subsequent to FIG. 8.

Next, as shown in FIG. 9, a manufacturing step of the source region RSU of the power transistor UMOS, the source region RSN and drain region RDN of the n-type transistor NMOS, and the source region RSP and drain region RDP of the p-type transistor PMOS is performed. In the first main surface SBa of the laminated semiconductor substrate SB, an n-type semiconductor region and a p-type semiconductor region are selectively formed on the surface of the base layer BL by using an ion implantation method. The n-type semiconductor region has an n-type impurity concentration of 1e20 $cm^{-3}$ and is continuously formed in a range of a depth of 0.25 μm from the first main surface SBa. Incidentally, the n-type impurity concentration may be in a range of 1e19 to 1e22 $cm^{-3}$, and the depth may be in a range of 0.1 to 0.4 μm. The n-type impurity region configures the source region RSU of the power transistor UMOS in the power transistor region ARU, the source region RSN and the drain region RDN of the n-type transistor NMOS in the NMOS region ARN, and the n-type region RNC in the PMOS region ARP. Then, the p-type semiconductor region is formed continuously at a p-type impurity concentration of 1e21 $cm^{-3}$ and in a range of a depth of 0.25 μm from the first main surface SBa. Incidentally, the p-type impurity concentration may be in a range of 1e19 to 1e22 $cm^{-3}$ and the depth may be in a range of 0.1 to 0.4 μm. The p-type semiconductor region configures the p-type region RPU of the power transistor UMOS in the power transistor region ARU, the source region RSP and the drain region RDP of the p-type transistor PMOS in the PMOS region ARP, and the p-type region RPC in the NMOS region ARN. Incidentally, the n-type semiconductor region and the p-type semiconductor region of the power transistor region ARU and the CMOS region ARC may be formed in the same step or may be formed in a separate step. Further, an n-type well region NW formation step, an n-type semiconductor region formation step, and a p-type semiconductor region formation step as mentioned above are out of order.

Figure 10:
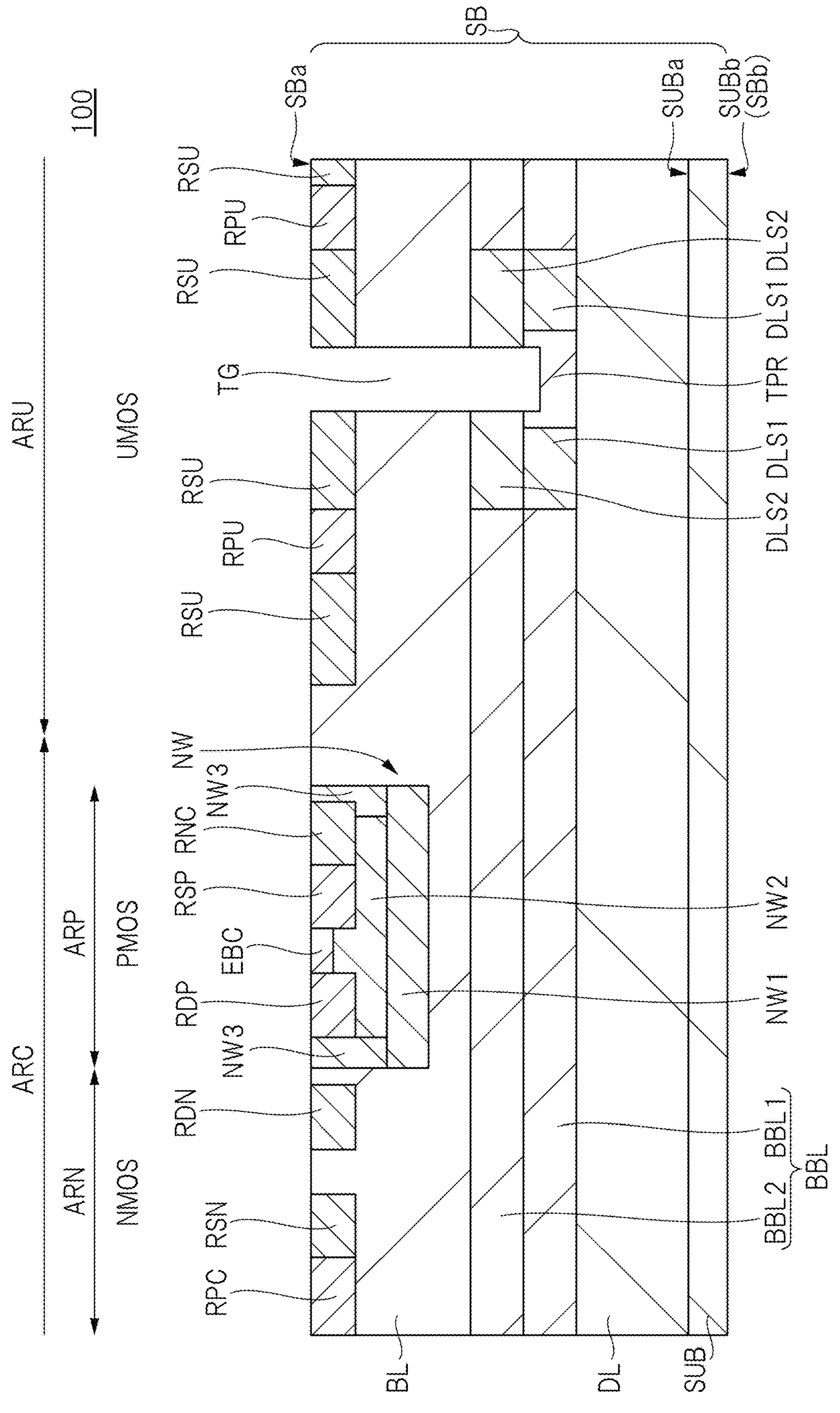
FIG. 10 is a cross-sectional view showing the manufacturing process of the semiconductor device subsequent to FIG. 9.

Next, as shown in FIG. 10, a manufacturing step of a trench groove TG is performed. A plurality of trench grooves TG are formed in the power transistor region ARU by a reactive dry etching method. The trench groove TG has a size of a width of 0.8 μm, a depth of 2.5 to 2.6 μm, a length (vertical direction of paper surface) of 1500 to 2000 μm, penetrates the source region RSU, the base layer BL, and the JFET layer DLS2, and bites into the trench protection region TPR. By performing an annealing treatment after forming the trench grooves TG, correction of a shape such as rounding of corner portions may be made. Next, as an activation treatment of the impurities introduced by using the above-mentioned ion implantation method, for example, an activation anneal is performed under conditions of 1800° C. and 5 minutes in an argon (Ar) atmosphere. This activation anneal also contributes to recovery of crystalline damage in the buried channel region EBC. As previously mentioned in the description of FIG. 8, crystal damage such as a certain degree of crystal defect occurs in the buried channel region EBC since nitrogen ions are not left but passes in the ion implantation step in forming the n-type well layer 1 NW1 and the n-type well layer 2 NW2 in the p-type base layer BL. It is known that the crystal damage of the SiC semiconductors caused during the nitrogen ion implantation is recovered by the above-mentioned activation anneal.

Figure 11:
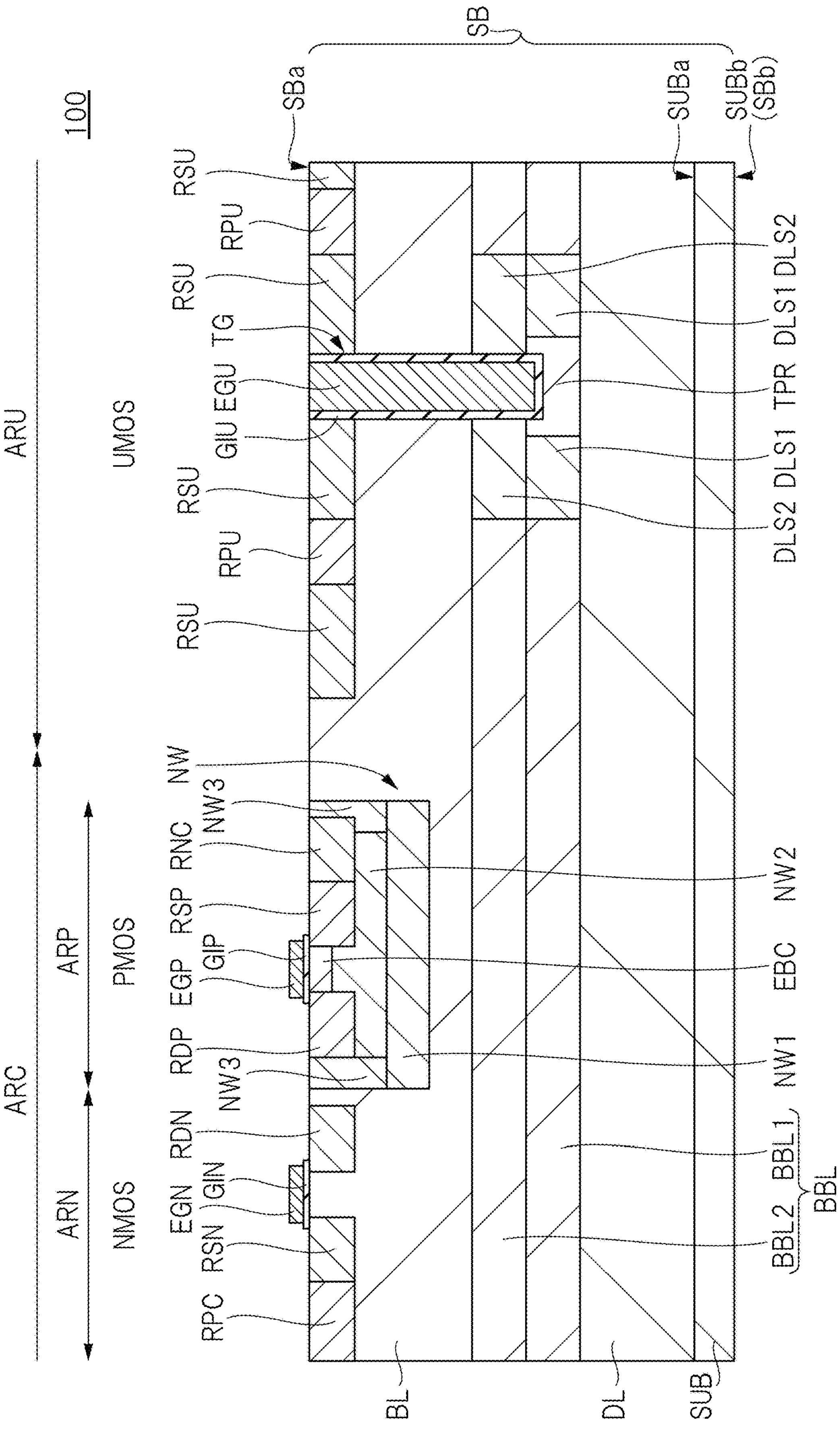
FIG. 11 is a cross-sectional view showing the manufacturing process of the semiconductor device subsequent to FIG. 10.

Next, as shown in FIG. 11, a manufacturing step of the gate insulating films GIU, GIN, and GIP and the gate electrodes EGU, EGN, and EGP is performed. The gate insulating film GIU is formed on sidewalls and a bottom portion of the trench groove TG in the power transistor region ARU, and the gate insulating films GIP and GIN are formed on the first main surface SBa in the CMOS region ARC. The gate insulating films GIU, GIP, and GIN are configured of a silicon oxide film formed by using a CVD deposition method, and a film thickness thereof is in a range of 50 to 150 nm, for example, 90 nm. After forming the gate insulating films GIU, GIP, and GIN, an annealing treatment is performed in a nitric oxide atmosphere for an interface level reduction.

Figure 12:
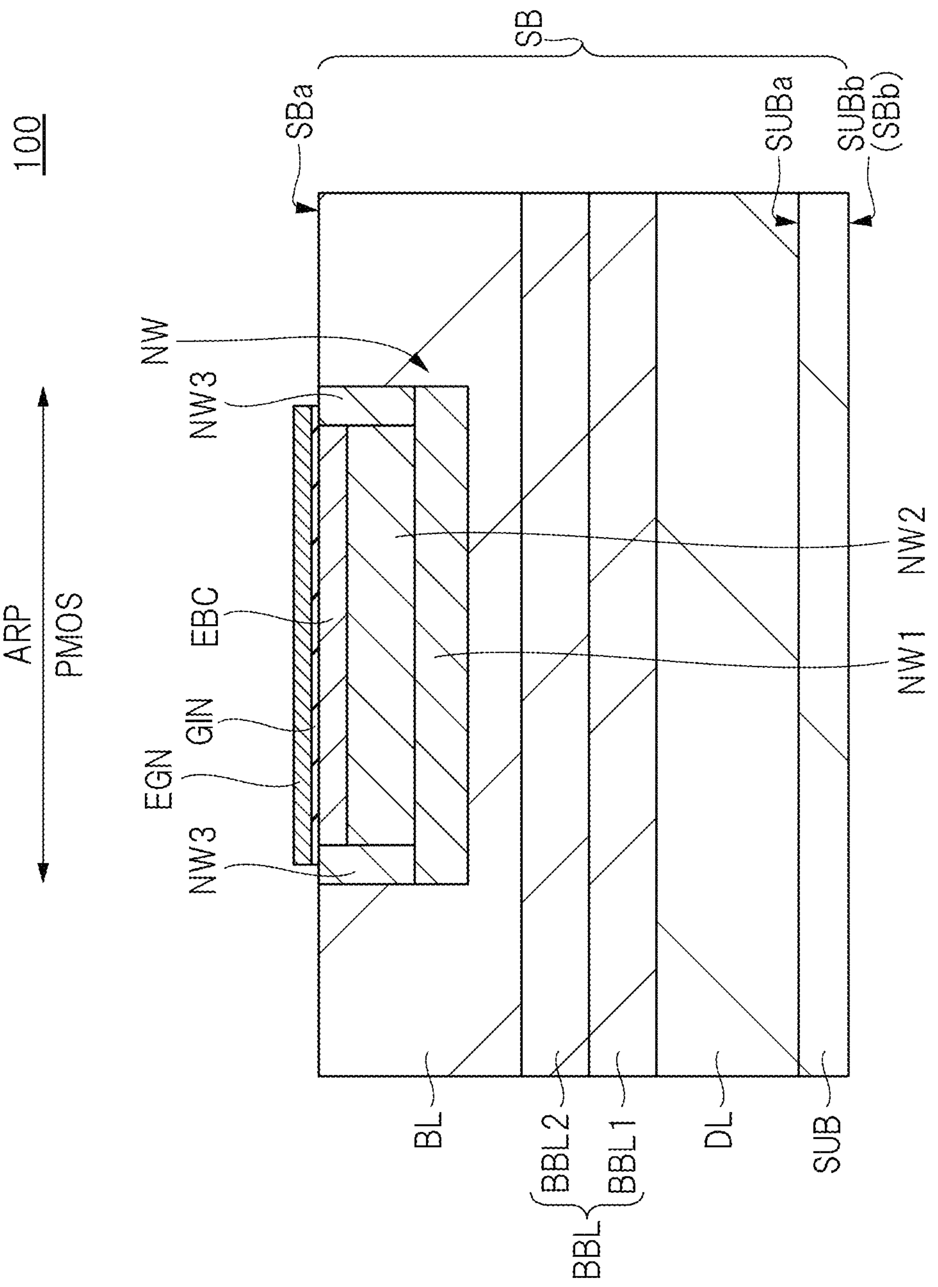
FIG. 12 is a cross-sectional view showing the manufacturing process of the semiconductor device subsequent to FIG. 10.

Next, the gate electrode EGU is formed on the gate insulating film GIU in the power transistor region ARU, and the gate electrode EGP is formed on the gate insulating film GIP and the gate electrode EGN is formed on the gate insulating film GIN in the CMOS region ARC. The gate electrodes EGU, EGP, and EGN are formed of a n-type polysilicon film in a range of a film thickness of 0.3 to 1 μm, for example, a film thickness of 0.5 μm. It is important that the film thickness of the n-type polysilicon film is such a film thickness that the trench groove TG is buried. FIG. 12 shows a cross-sectional structure of the p-type transistor PMOS in a gate width direction at a stage of forming the gate insulating film GIP and the gate electrode EGP in the PMOS region ARP. In the gate width direction, the buried channel region EBC has both ends that contact with the n-type well layer NW3 and become terminal, and each of the gate insulating film GIP and the gate electrode EGP has both ends extending on the n-type well layer NW3. Although not shown in the figures, both ends of the source region RSP and the drain region RDP extending in the gate width direction also contact with the n-type well layer NW3 and become terminal. By adopting such a structure, a current can be prevented from flowing between the source and the drain with a gate voltage lower than the threshold voltage at an end portion of the gate electrode EGP in the gate width direction.

Figure 13:
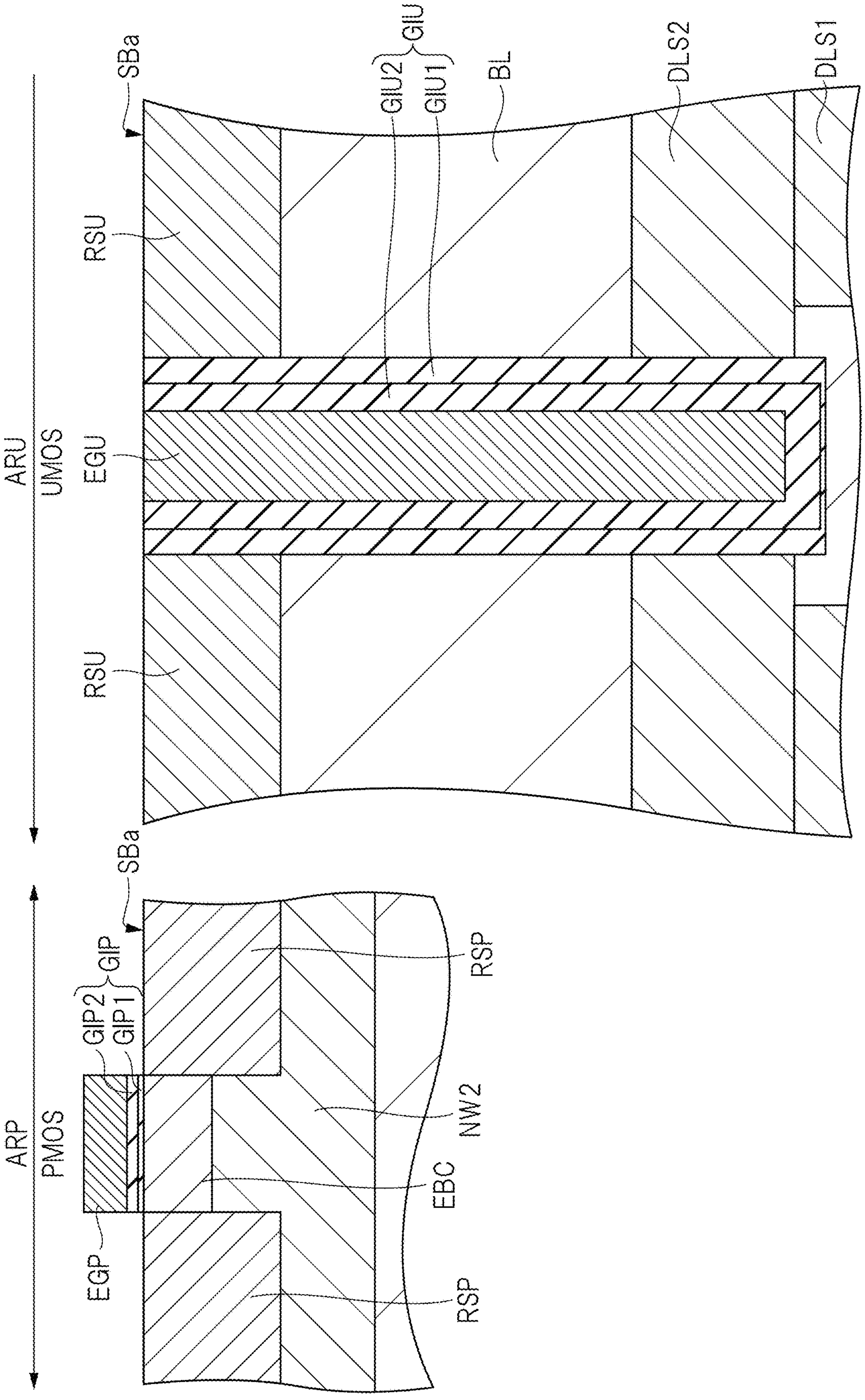
FIG. 13 is a cross-sectional view showing a manufacturing process of a semiconductor device that is a modification example of FIG. 11.

Incidentally, FIG. 13 is a cross-sectional view showing a manufacturing process of a semiconductor device that is a modification example of FIG. 11, and a cross-sectional view for explaining a manufacturing step of the gate insulating film GIU of the power transistor UMOS and the gate insulating film GIP of the p-type transistor PMOS. The gate insulating film GIU of the power transistor UMOS is a laminated film of a gate insulating film GIU1 and a gate insulating film GIU2 formed thereon. The gate insulating film GIU2 is a CVD oxide film formed on the sidewall of the trench groove TG by using a CVD method, and the gate insulating film GIU1 is a thermal oxide film formed between the sidewall of the trench groove TG and the gate insulating film GIU2 by a thermal oxidation method. Also, the gate insulating film GIP of the p-type transistor PMOS is a laminated film of a gate insulating film GIP1 and a gate insulating film GIP2 formed thereon. The gate insulating film GIP2 is a CVD oxide film formed on the first main surface SBa by using a CVD method, and the gate insulating film GIP1 is a thermal oxide film formed between the first main surface SBa and the gate insulating film GIU2 by a thermal oxidation method. Here, film thicknesses of the gate insulating film GIU2 and the gate insulating film GIP2, which are CVD oxide films, are equal to each other. Then, a film thickness of a sidewall portion of the gate insulating film GIU1, which is a thermal oxide film, is thicker than the film thickness of the gate insulating film GIP1, which is a thermal oxide film. Therefore, the film thickness of the gate insulating film GIU on the sidewall portion of the power transistor UMOS is thicker than the film thickness of the gate insulating film GIP of the p-type transistor PMOS. Since a higher electric field is applied to the gate insulating film GIU of the power transistor UMOS in comparison with the gate insulating film GIP of the p-type transistor PMOS, it is effective to have such a film thickness relationship.

Namely, a high breakdown voltage of the gate insulating film GIU of the power transistor UMOS and speed-up of the p-type transistor PMOS can be realized. Incidentally, a bottom portion of the gate insulating film GIU1 of the power transistor UMOS is thinned similarly to the gate insulating film GIP1 of the p-type transistor PMOS, but reliability is ensured because the electric field is sufficiently relaxed by the trench protection region TPR.

Further, the gate insulating film GIU1 and the gate insulating film GIP1 are formed in a thermal oxidation step after forming the gate insulating films GIU2 and GIP2 by a CVD method. In the laminated semiconductor substrate SB made of SiC, a growth rate of the thermal oxide film is significantly different between the first main surface SBa and the sidewall of the trench groove TG. Since the growth rate of the thermal oxide film depends on a crystal plane, the growth rate of the thermal oxide film on the sidewall of the trench groove TG is approximately ten times the growth rate of the thermal oxide film on the first main surface SBa. This feature is utilized to form the gate insulating films GIU1 and GIP1 of different film thicknesses in a self-forming manner without increasing the number of manufacturing steps such as photolithography and etching. It is also possible to perform a heat treatment step once in combination with an annealing treatment (baking or nitric oxide anneal) performed after forming the gate insulating film GIU2. Incidentally, the gate insulating film GIN of the n-type transistor NMOS in the CMOS region ARC can also be made a laminated film similarly to the gate insulating film GIP of the p-type transistor PMOS.

Next, as shown in FIG. 1, a manufacturing step of the source electrodes ESU, ESP, and ESN and the drain electrodes ED, EDP, and EDN is performed. An interlayer dielectric film IL is formed on the first main surface SBa. The interlayer dielectric film IL is made of, for example, a silicon oxide film having a film thickness of 1.0 μm deposited by using a CVD method. After forming a plurality of openings in the interlayer dielectric film IL, a metal film is deposited and patterned to form a first wiring layer including the source electrodes ESU, ESP, and ESN and the drain electrodes EDP and EDN. The metal film is, for example, a laminated film of a titanium (Ti) film and an aluminum (Al) film on the titanium film. For example, a film thickness of the titanium film is 0.1 μm and a film thickness of the aluminum film is 2 μm. In the power transistor region ARU, the source electrode ESU is connected to the source region RSU and the p-type region RPU. In the PMOS region ARP, the source electrode ESP is connected to the source region RSP and the n-type region RNC, and the drain electrode EDP is connected to the drain region RDP. In the NMOS region ARN, the source electrode ESN is connected to the source region RSN and the p-type region RPC, and the drain electrode EDN is connected to the drain region RDN. Although not shown in the figures, a connection relationship shown in FIG. 3 and a power source terminal Ts, a CMOS power supply potential terminal TVDD, a CMOS reference potential terminal TVSS, and an input signal terminal TVin shown in FIG. 2 are configured by using a second wiring layer formed on an upper layer of the first wiring layer. In addition, the drain electrode ED is formed on the second main surface SUBb of the semiconductor substrate SUB. The semiconductor device 100 according to the present embodiment is completed through the above-mentioned steps.

<Trial Result of Semiconductor Device of Present Embodiment>

A switching characteristic evaluation of an initial prototype device of the semiconductor device having the structure of FIG. 1 was made. The evaluation was made by connecting one end of a load, in which a reflux diode and an inductor (5 mH) were connected in parallel, to a Vd terminal of an equivalent circuit diagram shown in FIG. 3 and by applying 600 V to the other of the load. The VSS terminal and the Vs terminal were grounded and 20 V was applied to the VDD terminal. A switching characteristic observed at the Vd terminal when a pulse of about 20V amplitude is applied to the Vin terminal was a rise time of 24 ns and a fall time of 28 ns at an amplitude of 600 V and a drain current of 10 A.

<Features of Semiconductor Device and Its Manufacturing Method>

The semiconductor device of the present embodiment incorporates the power transistor UMOS, and the p-type transistor PMOS and the n-type transistor NMOS, which configure its CMOS drive circuit, on the semiconductor substrate SUB. Then, cost reduction of the semiconductor device is realized by forming the n-type transistor NMOS, and the p-type transistor PMOS, which has the buried channel region EBC, in the base layer BL which is a channel forming region of the power transistor UMOS.

In addition, a portion of the base layer BL formed by the epitaxial layer is made the buried channel region EBC, so that lower threshold voltage and lower on-resistance of the p-type transistor PMOS become possible and improvement in a drive current increase and a HIGH/LOW noise margin balance of the CMOS drive circuit is realized.

A relatively high concentration and relatively thin buried base layer BBL is provided on the drift layer DL, a relatively low concentration and a relatively thick base layer BL is provided, the base layer BL is made the channel forming region of the power transistor UMOS, and the n-type transistor NMOS and the p-type transistor PMOS arranged in the n-type well region NW are formed in the base layer BL. The breakdown voltage between the drain and the source of the power transistor UMOS can be improved by providing the relatively high concentration buried base layer BBL on the drift layer DL. The on-resistance of the power transistor UMOS can be reduced by making the relatively low concentration base layer BL the channel forming region of the power transistor UMOS. By forming the n-type transistor NMOS and the p-type transistor PMOS, which is arranged in the n-type well region NW, in the relatively thick base layer BL, the degree of freedom of design such as a PN junction reverse bias breakdown voltage of the n-type transistor NMOS and the p-type transistor PMOS can be improved.

The n-type well region NW is configured by a relatively high concentration n-type well layer NW1 and a relatively low concentration n-type well layer NW2 which is arranged thereon. Since the n-type well layer NW2 having contact with the buried channel region EBC has a relatively low concentration, the controllability and the degree of freedom of the design of the impurity concentration of the buried channel region EBC can be improved, and the threshold voltage controllability of the p-type transistor PMOS can be improved. Further, by providing the relatively high concentration n-type well layer NW1, the depletion layer from the drain region RDP can be prevented from punching through the n-type well region NW by the drain voltage in the PMOS region ARP. In addition, the parasitic Bip transistor configured by the source region RSP/n-type well region NW/base layer BL can be prevented from being turned on.

Further, each of the gate insulating film GIU of the power transistor UMOS, the gate insulating film GIP of the p-type transistor PMOS, and the gate insulating film GIN of the n-type transistor NMOS has a laminated structure of a thermal oxide film and a CVD oxide film, so that the gate insulating film GIU having a film thickness thicker than those of the gate insulating films GIN and GIP can be formed in a self-forming manner without increasing the manufacturing steps such as photolithography and etching.

First Modification Example

Figure 14:
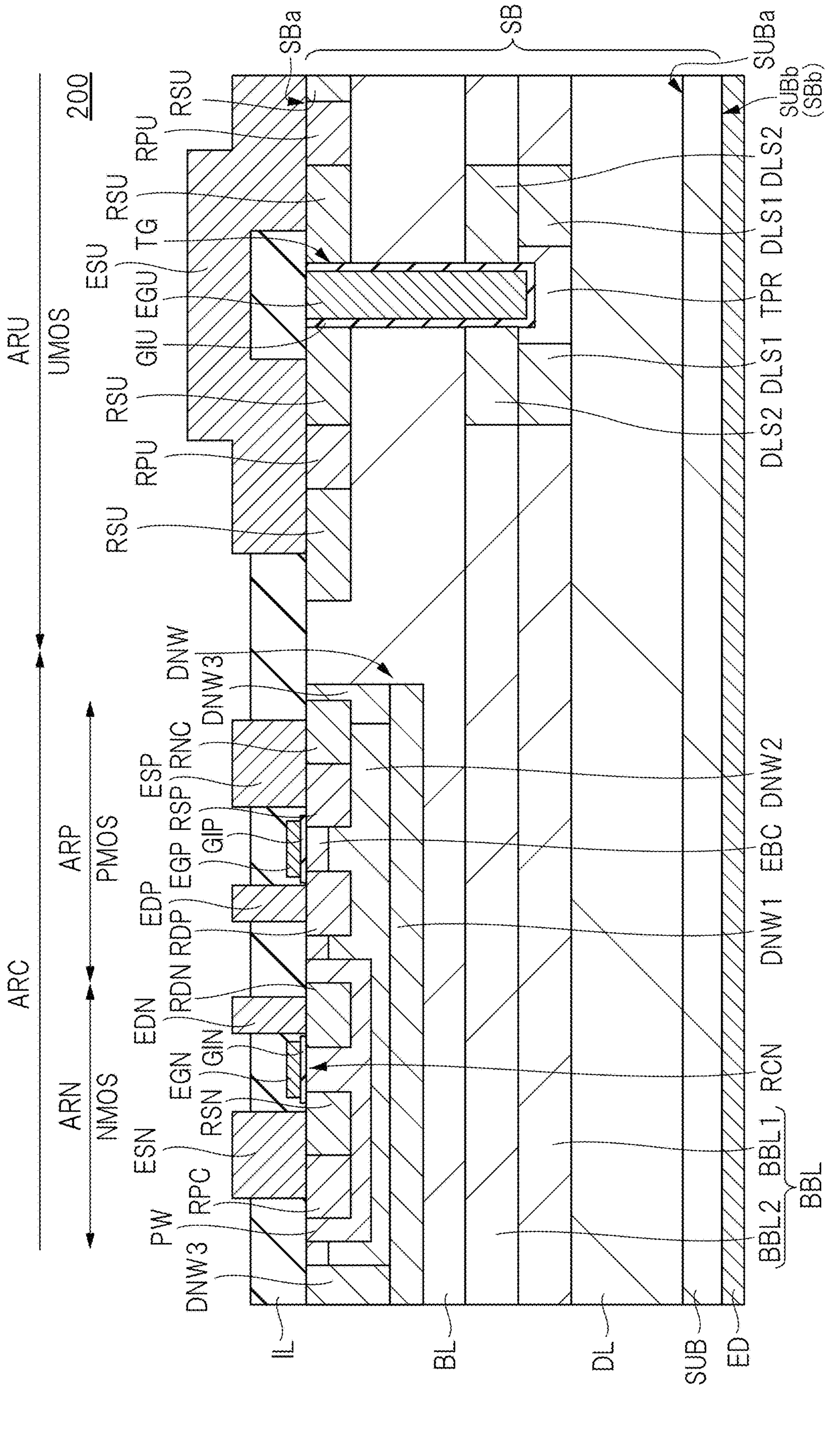
FIG. 14 is a cross-sectional view of the semiconductor device of a first modification example.

FIG. 14 is a cross-sectional view of a semiconductor device 200 of a first modification example. A difference between the first modification example and the above-mentioned embodiment is that in the CMOS region ARC, the n-type transistor NMOS and the p-type transistor PMOS are provided in the n-type well region DNW. The n-type transistor NMOS is formed in the p-type well region (p-type semiconductor region) PW provided in the n-type well region DNW. The n-type well region DNW is configured of the n-type well layer 1 DNW1, the n-type well layer 2 DNW2, and the n-type well layer 3 DNW3. The n-type impurity concentrations of the n-type well layer 1 DNW1, the n-type well layer 2 DNW2, and the n-type well layer 3 DNW3 are similar to those of the n-type well layer 1 NW1, the n-type well layer 2 NW2, and the n-type well layer 3 NW3 of the embodiment described above. However, the depths of the n-type well layer 1 DNW1, the n-type well layer 2 DNW2, and the n-type well layer 3 DNW3 has a depth sufficient to enclose the p-type well region PW. Also, the n-type well layer 3 DNW3 is annularly arranged so as to continuously surround the periphery of the NMOS region ARN and the PMOS region ARP in a plan view. Namely, the source electrode ESU of the power transistor UMOS and the source electrode ESN of the CMOS region ARC form a PNP junction via the n-type well region DNW inside the laminated semiconductor substrate SB and are electrically separated. Therefore, even if a potential difference occurs between the source electrode ESU and the source electrode ESN, a current can be prevented from flowing therebetween via the inside of the laminated semiconductor substrate SB.

In the semiconductor device 100 of the above-mentioned embodiment, as shown in FIGS. 1 and 3, the source electrode ESU of the power transistor UMOS and the source electrode ESN of the CMOS region ARC are electrically connected as shown by a dotted line in FIG. 3 in a path of the p-type region RPU/base layer (p-type semiconductor region) BL and the buried base layer (p-type semiconductor region) BBL/p-type region RPC. Therefore, if a potential difference occurs between the source electrode ESU of the power transistor UMOS and the source electrode ESN of the CMOS region ARC, the current continues to flow in this path, thereby leading to an increase in loss and breakdown of an element (power transistor UMOS, n-type transistor NMOS or p-type transistor PMOS).

Figure 15:
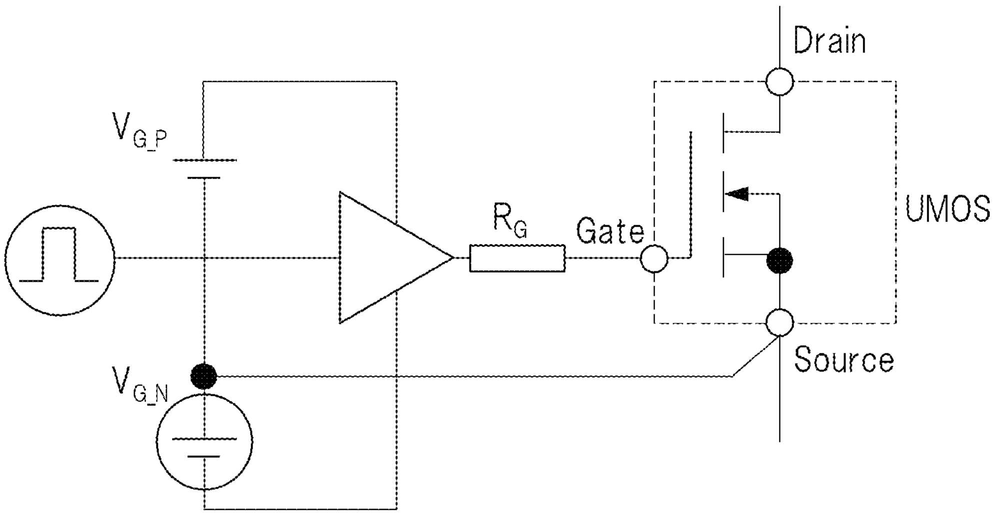
FIG. 15 is an equivalent circuit diagram showing one example of a false turn-on countermeasure.

FIG. 15 is an equivalent circuit diagram showing one example of a false turn-on countermeasure. When the power transistor UMOS is used in a bridge configuration, there is a phenomenon in which: a high voltage variation dV/dt occurs between the drain and the source of the power transistor UMOS on a non-switching side in conjunction with an operation of the power transistor UMOS on a switching side; a current due to this flows into the gate through capacitance between the drain and the gate; and the power transistor UMOS on the non-switching side is turned on in spite of a gate voltage being raised by the voltage drop due to gate resistance $R_G$ and an off signal coming to the gate. This is referred to as false turn-on (self-turn-on). As shown in FIG. 15, if a turn-off voltage of the power transistor UMOS is set to a negative voltage ($V_{G\_N}$), the gate voltage does not exceed the threshold voltage of the power transistor UMOS even when the rise of the gate voltage, which triggers the false turn-on, occurs. However, in the case of the semiconductor device 100 of the above-mentioned embodiment, there is a problem in which since a potential difference occurs between the source electrode ESU of the power transistor UMOS and the source electrode ESN of the CMOS region ARC, the current continues to flow in the above-mentioned path.

According to the semiconductor device 200 of the first modification example, as described above, therefore, even if the potential difference occurs between the source electrode ESU and the source electrode ESN, the current flowing therebetween can be interrupted via the inside of the laminated semiconductor substrate SB.

Second Modification Example

Figure 16:
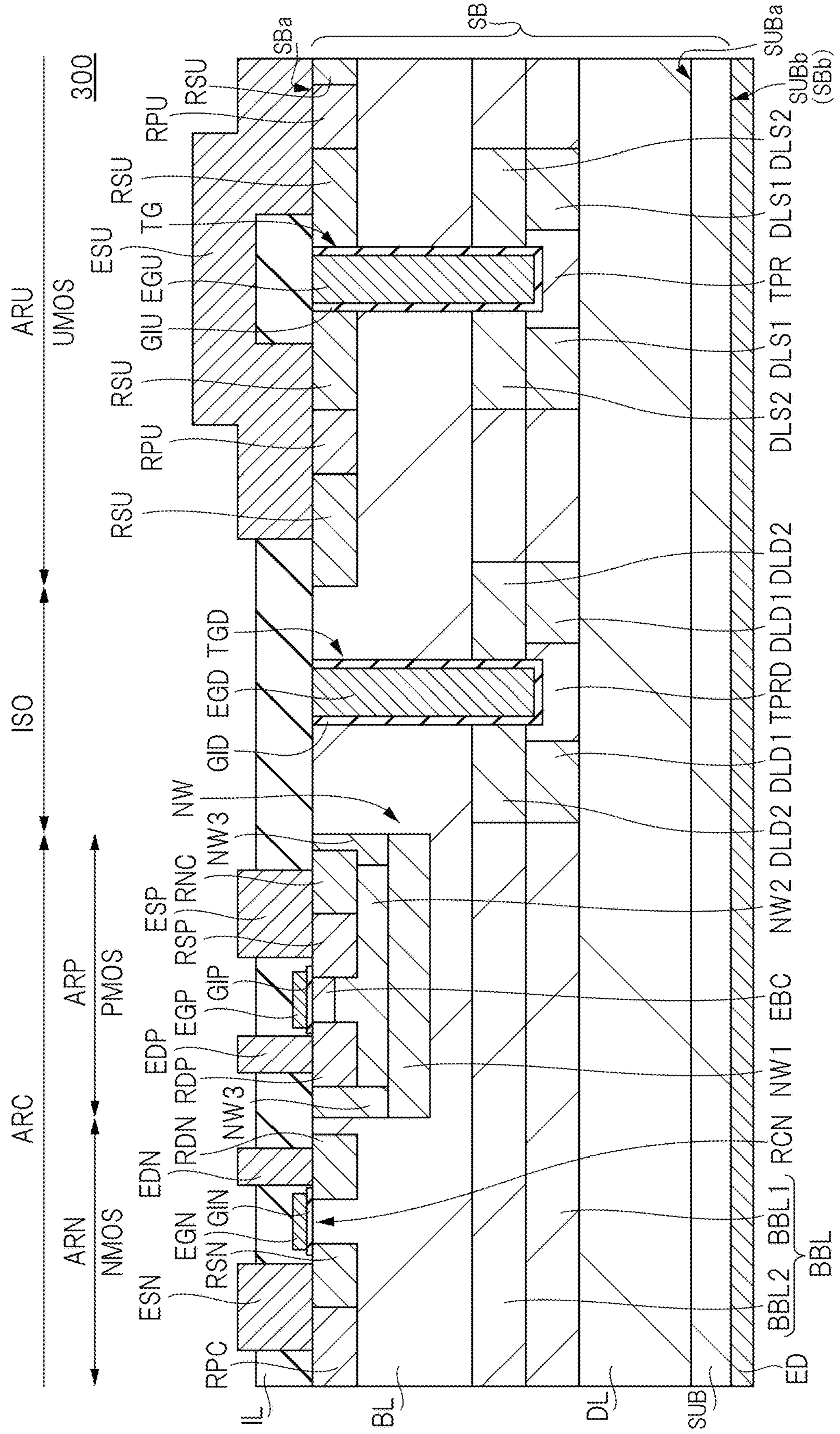
FIG. 16 is a cross-sectional view of a semiconductor device of a second modification example.

FIG. 16 is a cross-sectional view of a semiconductor device 300 of a second modification example. A difference between a second modification example and the above-mentioned embodiment is that an isolation region ISO is provided between the power transistor region ARU and the CMOS region ARC. A trench groove TGD, a JFET layer 1 DLD1, a JFET layer 2 DLD2, and a trench protection region TPRD are provided in the isolation region ISO, and the base layers BL in the power transistor region ARU and the CMOS region ARC are electrically separated by the trench groove TGD penetrating through the base layers BL. In addition, the buried base layers BBL in the power transistor region ARU and the CMOS region ARC are electrically separated by the JFET layer 1 DLD1 and the JFET layer 2 DLD2. A structure of the trench groove TGD, the gate insulating film GID, the gate electrode EGD, the trench protection region TPRD, the JFET layer 1 DLD1, and the JFET layer 2 DLD2 in the isolation region ISO is similar to the structure of the trench groove TG, the gate insulating film GIU, the gate electrode EGU, the trench protection region TPR, the JFET layer 1 DLS1 and the JFET layer 2 DLS2 in the power transistor region ARU, and the manufacturing steps are also similar to each other. Also, the isolation region ISO is annularly arranged so as to continuously surround the periphery of the power transistor region ARU or the periphery of the CMOS region ARC in a plan view.

Therefore, even if the potential difference occurs between the source electrode ESU and the source electrode ESN as in the above-mentioned first modification example, the current flowing therebetween can be interrupted via the inside of the laminated semiconductor substrate SB. Further, the manufacturing step of the power transistor UMOS is used to form the structure of the isolation region ISO, so that an increase in the number of manufacturing steps is nothing.

Third Modification Example

Figure 17:
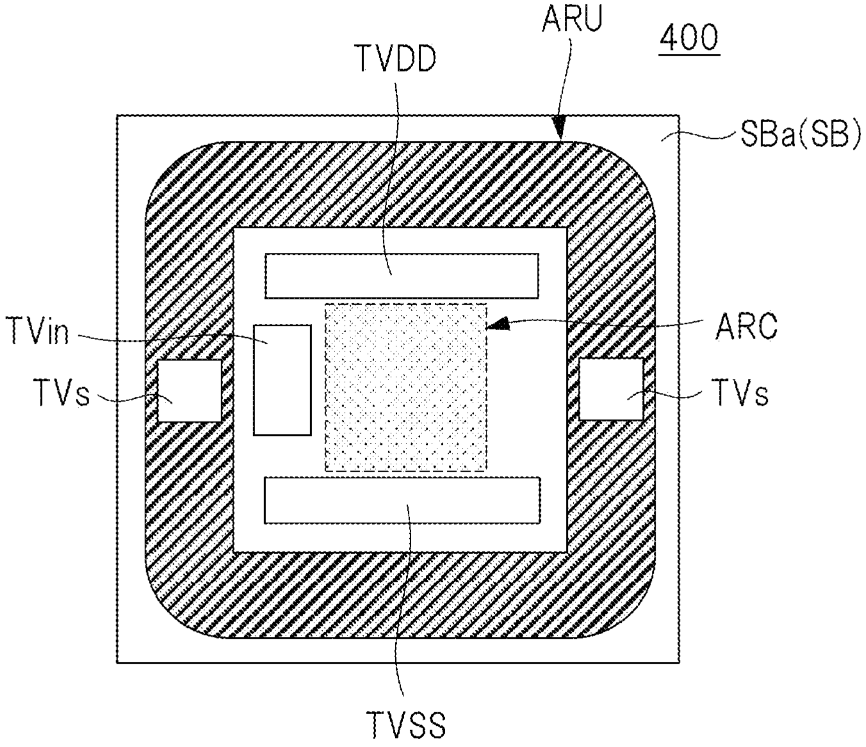
FIG. 17 is a plan view of a semiconductor device of a third modification example.
Figure 18:
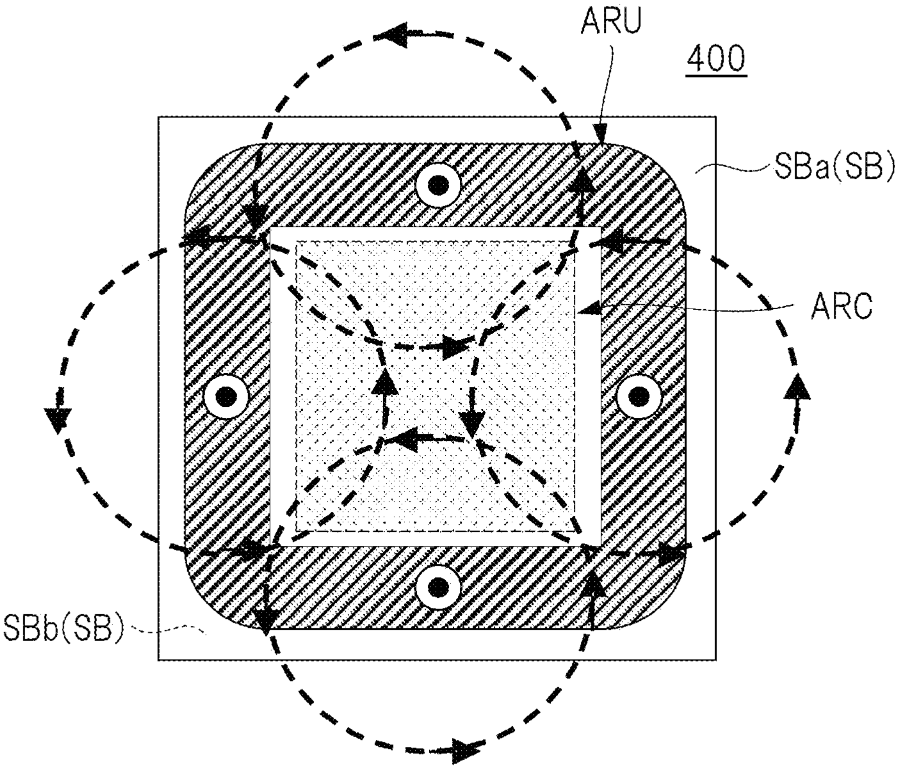
FIG. 18 is a plan view for explaining effects of the semiconductor device of the third modification example.

FIG. 17 is a plan view of a semiconductor device 400 of a third modification example, and FIG. 18 is a plan view for explaining an effect of the semiconductor device 400 of the third modification example. A difference between the third modification example and the above-mentioned embodiment is a power transistor region ARU, a CMOS region ARC, or other layout. On the first main surface SBa of the laminated semiconductor substrate SB, the CMOS region ARC is arranged at a central portion thereof, the CMOS power supply potential terminal VDD, the input signal terminal Vin, and the CMOS reference potential terminal VSS are arranged around the CMOS region ARC, and the power transistor region ARU is arranged annularly so as to surround the CMOS region ARC and the CMOS power supply potential terminal VDD, input signal terminal Vin, and CMOS reference potential terminal VSS.

A large current and a high voltage are applied to the power transistor UMOS, and electromagnetic noise is generated since a switching operation is rapidly turned on and off during the switching operation. This electromagnetic noise may adversely affect an operation of a drive circuit of the CMOS region ARC. By adopting a layout shown in FIG. 17, as shown in FIG. 18, the effect of the electromagnetic noise that the n-type transistor NMOS and the p-type transistor PMOS in the CMOS circuit region ARC arranged at the central portion of the first main surface SBa receive can be reduced. Its reason is as follows: since the current flows from the second main surface SBb toward the first main surface SBa in the power transistor region ARU in which the power transistor UMOS is arranged, a counterclockwise magnetic field is generated as shown in FIG. 18; however, the magnetic fields generated in power transistor regions ARU arranged left and right or up and down cancel each other at the central portion, resulting in reducing the electromagnetic noise.

In addition to the gate drive circuit of the power transistor UMOS, the CMOS circuit region ARC may be provided with a control circuit, a protection circuit, a sensor circuit, and the like of the drive circuit. Also, according to the layout of the third modification example, since the power transistor region ARU is distributed and arranged on the first main surface SBa, the third modification example has an effect of reducing heat generation density from the power transistor UMOS in comparison with the layout shown in FIG. 2.

Fourth Modification Example

Figure 19:
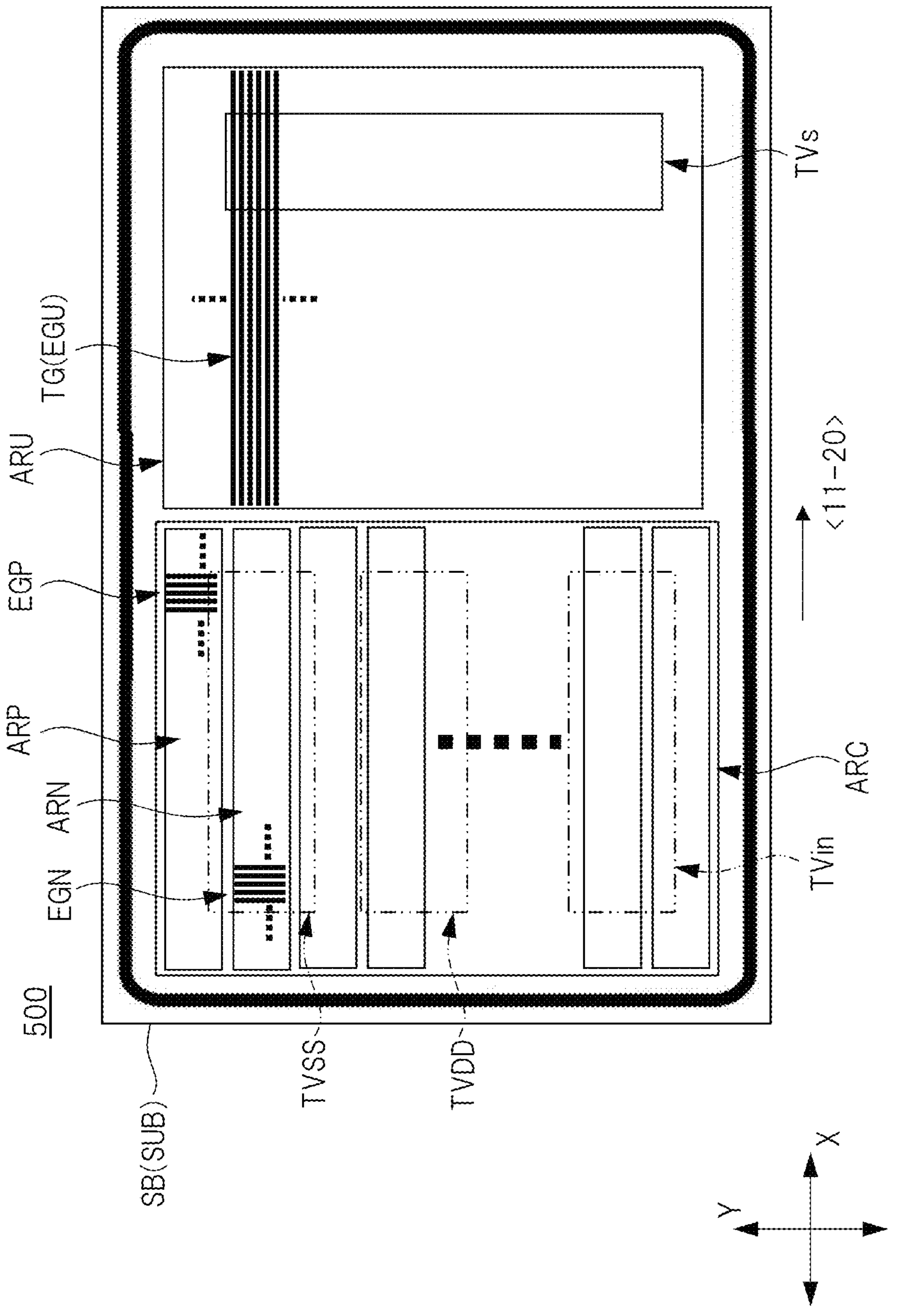
FIG. 19 is a plan view of a semiconductor device of a fourth modification example.

FIG. 19 is a plan view of a semiconductor device 500 of a fourth modification example. A difference between a fourth modification example and the above-mentioned embodiment is an arrangement of the CMOS reference potential terminal VSS, the CMOS power supply potential terminal VDD, and the input signal terminal Vin. The CMOS reference potential terminal VSS, the CMOS power supply potential terminal VDD and the input signal terminal Vin are arranged in the CMOS region ARC and on the PMOS region ARP or NMOS region ARN. By such an arrangement, miniaturization of the semiconductor device 500 can be realized.

Also, the semiconductor substrate SUB of the fourth modification example is n-type 4H—SiC. The first main surface SUBa of the semiconductor substrate SUB is, for example, a surface provided with an off angle θ° in a <11-20> direction, which is an off direction of the crystal, from a (0001) plane, and this surface is referred to as a θ° off (0001) plane. Here, θ° is $0<\theta<80$.

For example, it is assumed that the first main surface SUBa of the semiconductor substrate SUB is a 4° off (0001) plane. When the extension direction of the trench groove TG in which the gate electrode (EGU) of the power transistor UMOS is formed is made parallel to the off direction of the crystal, a channel forming surface of the trench groove TG becomes a (1-100) plane and a (−1100) plane and is not affected by the off angle. Meanwhile, when the extension direction of the trench groove TG is perpendicular to the <11-20> direction that is the off direction, the channel forming surface of the trench groove TG becomes a 4° off (11-20) plane at which a (11-20) plane is tilted by 4° in a <0001> direction and a 4° off (−1-120) plane at which a (−1-120) plane is tilted by 4° in a <0001> direction. If the channel forming surface is any of planes parallel to the <0001> direction, characteristics of the power transistor UMOS become good. This characteristic means that channel resistance is low and a threshold voltage is low. Also, if the channel forming surface has an off angle in the <0001> direction from a plane parallel to the <0001> direction, the characteristics of the power transistor UMOS are degraded.

Accordingly, in the power transistor region ARU, the extension direction of the trench groove TG in which the gate electrode (EGU) of the power transistor UMOS is formed is preferably parallel to the off direction of the crystal. Incidentally, the off direction is not limited to the <11-20> direction, but may be a <01-10> direction and be between the <11-20> direction and the <01-10> direction.

As described above, the invention made by the inventor of the present application has been specifically described based on the embodiments thereof, but the present invention is not limited to the above-mentioned embodiments and, needless to say, can be variously modified without departing from the scope thereof. The respective first to fourth modification examples can be combined in a consistent range. Incidentally, what is indicated by the term " . . . layer" in this specification includes not only a layer extending across the entire main surface of the semiconductor substrate like an epitaxial semiconductor growth layer but also a different portion or region of a conductivity type formed on a portion of the epitaxial semiconductor growth layer by using a mask and ion implantation. Further, the expressions " . . . on" and " . . . on the layer" are not only intended for structures that directly contact with the layer but also includes structures that interpose one or more other layers while retaining action and effect of the embodiments. For example, a buffer layer may be interposed when epitaxially growing a drift layer on a semiconductor substrate. Also, structures that change the impurity concentration stepwise in the layer direction may be adopted.

EXPLANATION OF REFERENCE NUMERALS

100 Semiconductor device
200 Semiconductor device
300 Semiconductor device
400 Semiconductor device
ARC CMOS region (drive circuit region)
ARN NMOS region
ARP PMOS region
ARU Power transistor region
BBL Buried base layer (p-type semiconductor layer)
BBL1 Buried base layer (p-type semiconductor layer)
BBL2 Buried base layer (p-type semiconductor layer)
BL Base layer (p-type semiconductor layer)
DL Drift layer (n-type semiconductor layer)
DLD1 JFET layer 1 (n-type semiconductor layer)
DL2 JFET layer 2 (n-type semiconductor layer)
DLS1 JFET layer 1 (n-type semiconductor layer)
DLS2 JFET layer 2 (n-type semiconductor layer)
DNW N-type well region (n-type semiconductor region)
DNW1 N-type well layer 1 (n-type semiconductor layer)
DNW2 N-type well layer 2 (n-type semiconductor layer)
DNW3 N-type well layer 3 (n-type semiconductor layer)
EBC Buried channel region (p-type semiconductor region)
ED Drain electrode
EDN Drain electrode EDP Drain electrode
EGD Gate electrode
EGU Gate electrode (trench gate electrode)
EGN Gate electrode
EGP Gate electrode
ESU Source electrode
ESN Source electrode
ESP Source electrode
GID Gate insulating film (trench gate insulating film)
GIN Gate insulating film
GIP Gate insulating film
GIP1 Gate insulating film
GIP2 Gate insulating film
GIU Gate insulating film (trench gate insulating film)
GIU1 Gate insulating film
GIU2 Gate insulating film
IL Interlayer dielectric film
ISO Isolation region
NMOS N-type transistor (n-type MOSFET)
NW N-type well region (n-type semiconductor region)
NW1 N-type well layer 1 (n-type semiconductor layer)
NW2 N-type well layer 2 (n-type semiconductor layer)
NW3 N-type well layer 3 (n-type semiconductor layer)
PMOS P-type transistor (p-type MOSFET)
PW P-type well region (p-type semiconductor region)
RCN Channel region (p-type semiconductor region)
RDN Drain region (n-type semiconductor region)
RDP Drain region (p-type semiconductor region)
RNC N-type region (n-type semiconductor region)
RPC P-type region (p-type semiconductor region)
RPU P-type region (p-type semiconductor region)
RSN Source region (n-type semiconductor region)
RSP Source region (p-type semiconductor region)
RSU Source region (power source region, n-type semiconductor region)
SB Laminated semiconductor substrate
SBa First main surface (main surface)
SBb Second main surface (rear surface)
SUB Semiconductor substrate
SUBa First main surface (main surface)
SUBb Second main surface (rear surface)
TG Trench groove
TGD Trench groove
TPR Trench protection region (p-type semiconductor region)
TPRD Trench protection region (p-type semiconductor region)
TVDD CMOS power supply potential terminal (CMOS power supply
potential pad)
TVin Input signal terminal (input signal pad)
TVs Power source terminal (power source pad)
TVSS CMOS reference potential terminal (CMOS reference potential pad)
MOS Power transistor (power MOSFET)

The invention claimed is:

1. A semiconductor device comprising:
a semiconductor substrate having a first main surface and a second main surface opposing the first main surface;
a first semiconductor layer of a first conductivity type, the first semiconductor layer being provided on the first main surface of the semiconductor substrate;
a second semiconductor layer provided on the first semiconductor layer and having a first portion of the first conductivity type and a second portion of a second conductivity type;
a third semiconductor layer of the second conductivity type, the third semiconductor layer being provided on the second semiconductor layer;
a power transistor provided in a power transistor region that is a part of a plan view layout on the first main surface of the semiconductor substrate; and
a drive circuit of the power transistor provided in a CMOS region that is another part of the plan view layout of the semiconductor substrate, the drive circuit being configured by a p-type MOSFET and an n-type MOSFET,
wherein the power transistor has:
a power source region of the first conductivity type, the power source region being selectively provided in a portion of the third semiconductor layer;
a trench groove penetrating through the power source region and the third semiconductor layer and having a depth reaching the second semiconductor layer;
a trench gate electrode provided in the trench groove via a trench gate insulating film;
a first source electrode connected to the power source region; and
a first drain electrode provided on the second main surface,
wherein the p-type MOSFET has:
a first source region of the second conductivity type and a first drain region of the second conductivity type, the first source region and the first drain region being formed in a first well region of the first conductivity type, the first well region being provided in a part of the third semiconductor layer;
a buried channel region of the second conductivity type, the buried channel region being provided between the first source region and the first drain region; and
a first gate electrode provided over the buried channel region via a first gate insulating film,
wherein the n-type MOSFET has:
a second source region of the first conductivity type and a second drain region of the first conductivity type, the second source region and the second drain region being provided in a part of the third semiconductor layer;
a channel region provided between the second source region and the second drain region; and
a second gate electrode provided on the channel region via a second gate insulating film, and
wherein an impurity concentration of the second conductivity type of the buried channel region is equal to an impurity concentration of the second conductivity type of the third semiconductor layer.

2. The semiconductor device according to claim 1,
wherein the channel region has the second conductivity type, and
wherein an impurity concentration of the second conductivity type of the buried channel region is equal to an impurity concentration of the second conductivity type of the channel region.

3. The semiconductor device according to claim 2,
wherein the third semiconductor layer is an epitaxial layer, and a thickness of the third semiconductor layer is larger than a depth of the first well region.

4. The semiconductor device according to claim 3,
wherein an impurity concentration of the third semiconductor layer is lower than an impurity concentration of the second portion of the second semiconductor layer, and wherein the thickness of the third semiconductor layer is thicker than a thickness of the second semiconductor layer.

5. The semiconductor device according to claim 1, wherein the first well region includes a fourth semiconductor layer of the first conductivity type, and a fifth semiconductor layer of the first conductivity type, the fourth semiconductor layer being provided over the fourth semiconductor layer, and wherein an impurity concentration of the fourth semiconductor layer is higher than an impurity concentration of the fifth semiconductor layer.

6. The semiconductor device according to claim 5, wherein the first well region further includes a sixth semiconductor layer of the first conductivity type, the sixth semiconductor layer having a higher impurity concentration than that of the fifth semiconductor layer, and wherein the sixth semiconductor layer surrounds the first source region, the first drain region, and the buried channel region in a plan view, and reaches the fourth semiconductor layer from a surface of the third semiconductor layer in a depth direction.

7. The semiconductor device according to claim 6, wherein the buried channel region has contact with the sixth semiconductor layer at an end portion of the first gate electrode in a gate width direction of the p-type MOSFET.

8. The semiconductor device according to claim 1, further comprising a second well region of the second conductivity type, the second well region being formed in the first well region, wherein the second source region, the channel region, and the second drain region of the n-type MOSFET are formed in the second well region.

9. The semiconductor device according to claim 1, further comprising, in a plan view, an isolation region provided between the power transistor region and the CMOS region, wherein the isolation region is further provided with a trench groove penetrating through the third semiconductor layer in a depth direction, and the third semiconductor layer of the power transistor region and the third semiconductor layer of the CMOS region are electrically isolated.

10. The semiconductor device according to claim 1, wherein in a plan view, the CMOS region is surrounded by the annular power transistor region.

11. The semiconductor device according to claim 1, wherein a film thickness of a sidewall portion of the trench gate insulating film is thicker than film thicknesses of the first gate insulating film and the second gate insulating film.

12. The semiconductor device according to claim 1, wherein the first main surface of the semiconductor substrate is a crystal surface having a predetermined off angle in a crystal axis direction that is an off direction, and wherein a plurality of trench grooves that are configured by the trench groove are arranged parallel to each other in the power transistor region and, in a plan view, the plurality of trench grooves extend in a crystal axis direction that is the off direction.

13. The semiconductor device according to claim 1, wherein the semiconductor substrate is made of a silicon carbide semiconductor.

14. A manufacturing method of a semiconductor device, the method comprising the steps of:

(a) preparing a semiconductor substrate having a first main surface and a second main surface opposing the first main surface, the first main surface including a power transistor region and a CMOS region;

(b) forming a first semiconductor layer of a first conductivity type on the first main surface of the semiconductor substrate by using an epitaxial growth method;

(c) forming a second semiconductor layer on the first semiconductor layer by using the epitaxial growth method, and forming a first portion of the first conductivity type and a second portion of the second conductivity type in the second semiconductor layer by using an ion implantation method;

(d) forming a third semiconductor layer of the second conductivity type on the second semiconductor layer by using the epitaxial growth method;

(e) forming a well region of the first conductivity type in the CMOS region by using the ion implantation method;

(f) forming a trench groove penetrating through the third semiconductor layer and having a depth reaching the second semiconductor layer in the power transistor region; and (g) forming a power transistor in the power transistor region by providing a power source region in the third semiconductor layer, a trench gate insulating film and a trench gate electrode in the trench groove, forming a p-type MOSFET in the CMOS region by providing a first source region, a buried channel region, and a first drain region in the well region, a first gate insulating film and a first gate electrode on the buried channel region, and forming an n-type MOSFET in the CMOS region by providing a second source region, a channel region, and a second drain electrode in the third semiconductor layer, a second gate insulating film and a second gate electrode on the channel region, wherein in the step (e), an impurity of the first conductivity type is ion-implanted at a position deeper than that of the buried channel region so as to leave the buried channel region of the second conductivity type, the buried channel region having a desired thickness on a surface of the third semiconductor layer.

15. The manufacturing method according to claim 14, wherein the trench gate insulating film is configured by a first laminated film of a first insulating film and a second insulating film on the first insulating film, and the first gate insulating film is configured by a second laminated film of a third insulating film and a fourth insulating film on the third insulating film, wherein the step of forming the trench gate insulating film and the first gate insulating film includes:

(g1) forming the second insulating film on a sidewall of the trench groove in the power transistor region, and the fourth insulating film on the third semiconductor layer in the CMOS region by using a CVD method; and (g2) forming the first insulating film between the sidewall of the trench groove in the power transistor region and the second insulating film, and the third insulating film between a surface of the third semiconductor layer and the fourth insulating film by using a thermal oxidation method, and wherein a film thickness of the first laminated film is thicker than a film thickness of the second laminated film.

* * * * *